US010809632B2

(12) United States Patent
Den Boef et al.

(10) Patent No.: US 10,809,632 B2
(45) Date of Patent: Oct. 20, 2020

(54) METROLOGY APPARATUS AND A METHOD OF DETERMINING A CHARACTERISTIC OF INTEREST

(71) Applicant: ASML Netherlands B.V., Veldhoven (NL)

(72) Inventors: Arie Jeffrey Den Boef, Waalre (NL); Ronald Joseph Antonius Van Den Oetelaar, Den Dungen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/181,455

(22) Filed: Nov. 6, 2018

(65) Prior Publication Data
US 2019/0137893 A1 May 9, 2019

(51) Int. Cl.
*G03F 7/20* (2006.01)
*G01N 21/21* (2006.01)
(Continued)

(52) U.S. Cl.
CPC ....... *G03F 7/70633* (2013.01); *G01N 21/211* (2013.01); *G01N 21/47* (2013.01);
(Continued)

(58) Field of Classification Search
CPC ..... B66C 23/42; B66C 23/701; B66C 23/707; G01N 21/211; G01N 21/47;
(Continued)

(56) References Cited

U.S. PATENT DOCUMENTS 5,035,507 A * 7/1991 Nishioki .................. G01D 5/38
356/499
5,689,339 A * 11/1997 Ota .......................... G03F 9/70
250/548
(Continued)

FOREIGN PATENT DOCUMENTS

EP          1 628 164 A2    2/2006
WO    WO 2004/008068 A1    1/2004
(Continued)

OTHER PUBLICATIONS

"Diffraction order control in overlay metrology—a review of the roadmap options," Metrology, Inspection, and Process Control for Microlithography XXII, Proceedings of SPIE, vol. 6922, 2008; pp. 1-19.
(Continued)

*Primary Examiner* — Sunghee Y Gray
(74) *Attorney, Agent, or Firm* — Sterne, Kessler, Goldstein & Fox P.L.L.C.

(57) ABSTRACT

A metrology apparatus for and a method of determining a characteristic of interest relating to at least one structure on a substrate. The metrology apparatus comprises a sensor and an optical system. The sensor is for detecting characteristics of radiation impinging on the sensor. The optical system comprises an illumination path and a detection path. The optical system is configured to illuminate the at least one structure with radiation received from a source via the illumination path. The optical system is configured to receive radiation scattered by the at least one structure and to transmit the received radiation to the sensor via the detection path.

4 Claims, 15 Drawing Sheets

(51) Int. Cl.
*G03F 9/00* (2006.01)
*G01N 21/47* (2006.01)

(52) U.S. Cl.
CPC ...... *G03F 7/70608* (2013.01); *G03F 7/70625* (2013.01); *G03F 7/70641* (2013.01); *G03F 7/70683* (2013.01); *G03F 9/7088* (2013.01)

(58) Field of Classification Search
CPC ............ G03F 7/70608; G03F 7/70625; G03F 7/70633; G03F 7/70641; G03F 7/70683; G03F 9/7088
USPC .................................................. 356/364–370
See application file for complete search history.

(56) References Cited

U.S. PATENT DOCUMENTS

| | | | | |
|---|---|---|---|---|
| 5,805,285 | A * | 9/1998 | Johs | G01J 3/36 250/225 |
| 6,952,253 | B2 | 10/2005 | Lof et al. | |
| 7,701,577 | B2 | 4/2010 | Straaijer et al. | |
| 7,791,724 | B2 | 9/2010 | Den Boef et al. | |
| 8,115,926 | B2 | 2/2012 | Straaijer | |
| 8,553,227 | B2 | 10/2013 | Jordanoska | |
| 8,681,312 | B2 | 3/2014 | Straaijer | |
| 8,692,994 | B2 | 4/2014 | Straaijer | |
| 8,792,096 | B2 | 6/2014 | Straaijer | |
| 8,797,554 | B2 | 8/2014 | Straaijer | |
| 8,823,922 | B2 | 9/2014 | Den Boef | |
| 10,338,484 | B2 | 7/2019 | Den Boef et al. | |
| 2004/0145744 | A1 * | 7/2004 | Dobschal | G01N 21/4788 356/446 |
| 2006/0098199 | A1 | 5/2006 | Nikoonahad et al. | |
| 2007/0296960 | A1 | 12/2007 | Den Boef et al. | |
| 2008/0198380 | A1 | 8/2008 | Straaijer et al. | |
| 2009/0168062 | A1 | 7/2009 | Straaijer | |
| 2010/0007863 | A1 | 1/2010 | Jordanoska | |
| 2010/0328655 | A1 | 12/2010 | Den Boef | |
| 2011/0026032 | A1 | 2/2011 | Den Boef et al. | |
| 2011/0032500 | A1 | 2/2011 | Straaijer | |
| 2011/0102753 | A1 | 5/2011 | Van De Kerkhof et al. | |
| 2011/0102793 | A1 | 5/2011 | Straaijer | |
| 2011/0188020 | A1 | 8/2011 | Den Boef | |
| 2011/0204265 | A1 | 8/2011 | Smith et al. | |
| 2011/0249244 | A1 | 10/2011 | Leewis et al. | |
| 2012/0044470 | A1 | 2/2012 | Smilde et al. | |
| 2012/0044495 | A1 | 2/2012 | Straaijer | |
| 2012/0123581 | A1 | 5/2012 | Smilde et al. | |
| 2013/0162996 | A1 | 6/2013 | Straaijer et al. | |
| 2013/0308142 | A1 | 11/2013 | Straaijer | |
| 2016/0161863 | A1 | 6/2016 | Den Boef et al. | |
| 2016/0370717 | A1 | 12/2016 | Den Boef et al. | |
| 2017/0146915 | A1 * | 5/2017 | Levinski | G02B 7/38 |
| 2017/0176870 | A1 * | 6/2017 | Hinnen | G03F 7/70641 |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2011/012624 A1 | 2/2011 |
| WO | WO 2013/152878 A2 | 10/2013 |
| WO | WO 2014/026819 A2 | 2/2014 |
| WO | WO 2014/056708 A2 | 4/2014 |
| WO | WO 2014/068116 A1 | 5/2014 |
| WO | WO 2016/030485 A1 | 3/2016 |
| WO | WO 2016/187468 A1 | 11/2016 |
| WO | WO 2017/055072 A1 | 4/2017 |

OTHER PUBLICATIONS

International Search Report and Written Opinion of the International Searching Authority directed to International Application No. PCT/EP2018/077306, dated Nov. 6, 2018; 12 pages.

International Preliminary Report on Patentability directed to International Patent Application PCT/EP2018/077306, dated May 12, 2020; 9 pages.

* cited by examiner

Fig. 13(a)
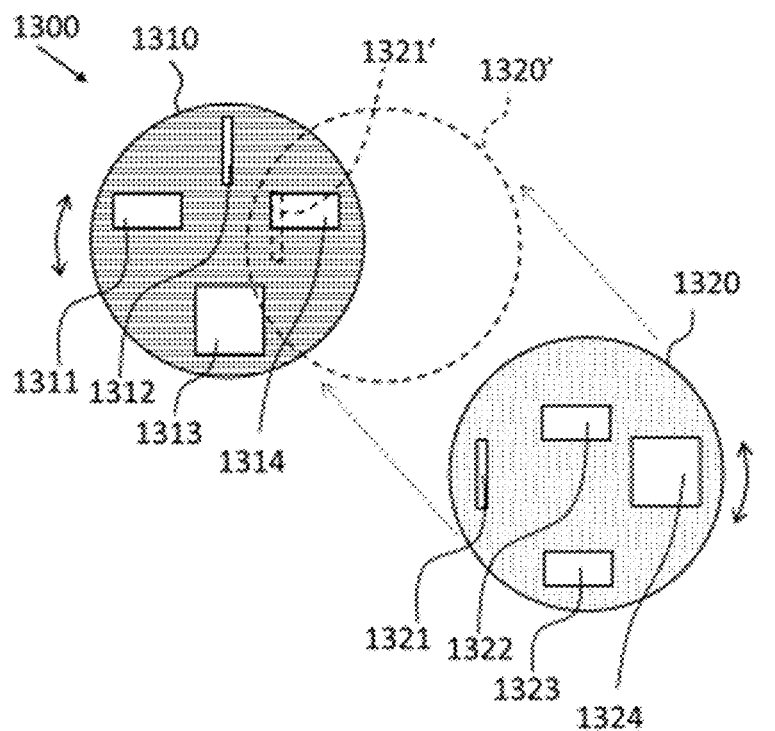
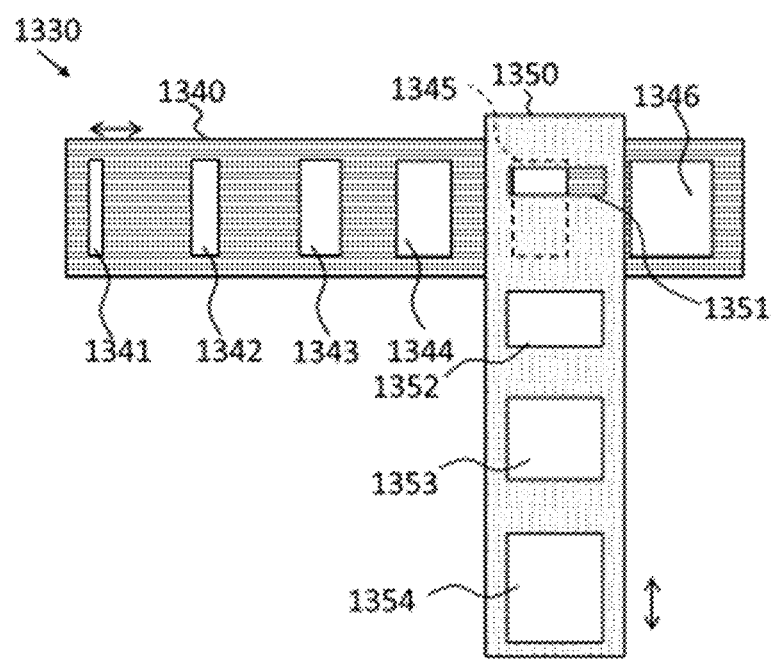
Fig. 13(b)

Fig. 14(a)
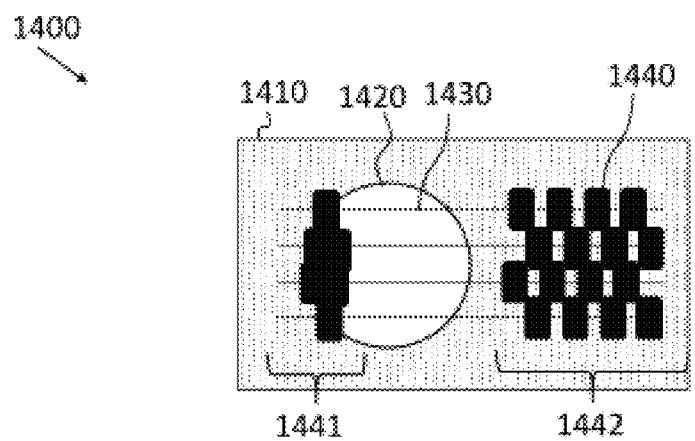
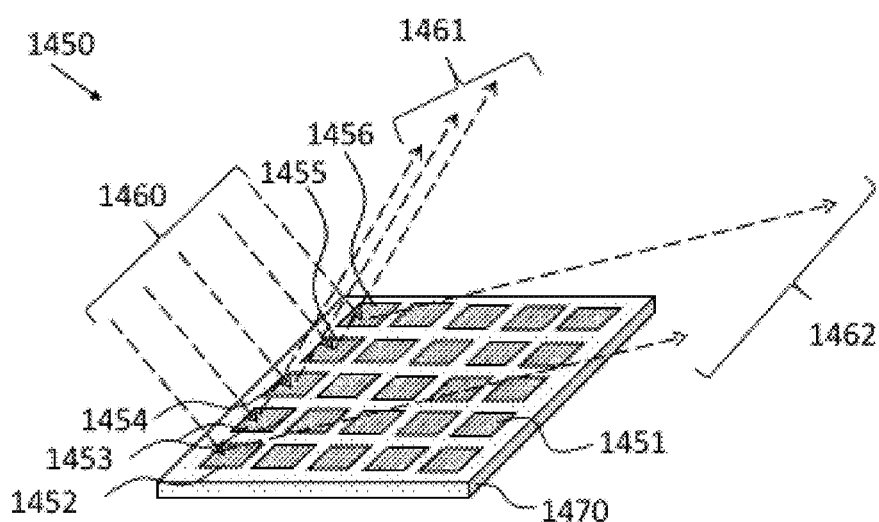
Fig. 14(b)

METROLOGY APPARATUS AND A METHOD OF DETERMINING A CHARACTERISTIC OF INTEREST

FIELD

The present invention relates to a metrology apparatus for determining a characteristic of interest of a structure on a substrate. The present invention also relates to a method of determining a characteristic of interest.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

In lithographic processes, it is desirable to make frequent measurements of the structures created, e.g., for process control and verification. Various tools for making such measurements are known, including scanning electron microscopes or various forms of metrology apparatuses, such as scatterometers. A metrology apparatus may be operable to determine an overlay value between two overlapping layers on a substrate. If the overlay value deviates from an expected value, the metrology apparatus can report the deviation from the expected value as an overlay error.

SUMMARY

It is an object to provide an effective and efficient solution for an inspection or metrology apparatus that is better than the known metrology or inspection apparatuses.

According to an aspect of the invention a metrology apparatus is provided as defined in the claims. According to a further aspect of the invention a method of determining a characteristic of interest relating to at least one structure on a substrate is provided as defined in the claims. The claims are hereby incorporated by reference.

BRIEF DESCRIPTION OF THE DRAWINGS

Embodiments of the invention will now be described, by way of example only, with reference to the accompanying schematic drawings, in which:

FIGS. 13(a) and 13(b) schematically depicts in FIGS. 13(a) and 13(b) examples of flexible and/or controllable illumination and detection pupil arrangements, FIGS. 14(a) and 14(b) schematically depicts in FIGS. 14(a) and 14(b) further examples of flexible and/or controllable illumination and detection pupil arrangements, FIG. 15 schematically depicts a further embodiment of a target.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV/soft-X-ray radiation (extreme ultra-violet radiation, e.g. having a wavelength in the range of about 1-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
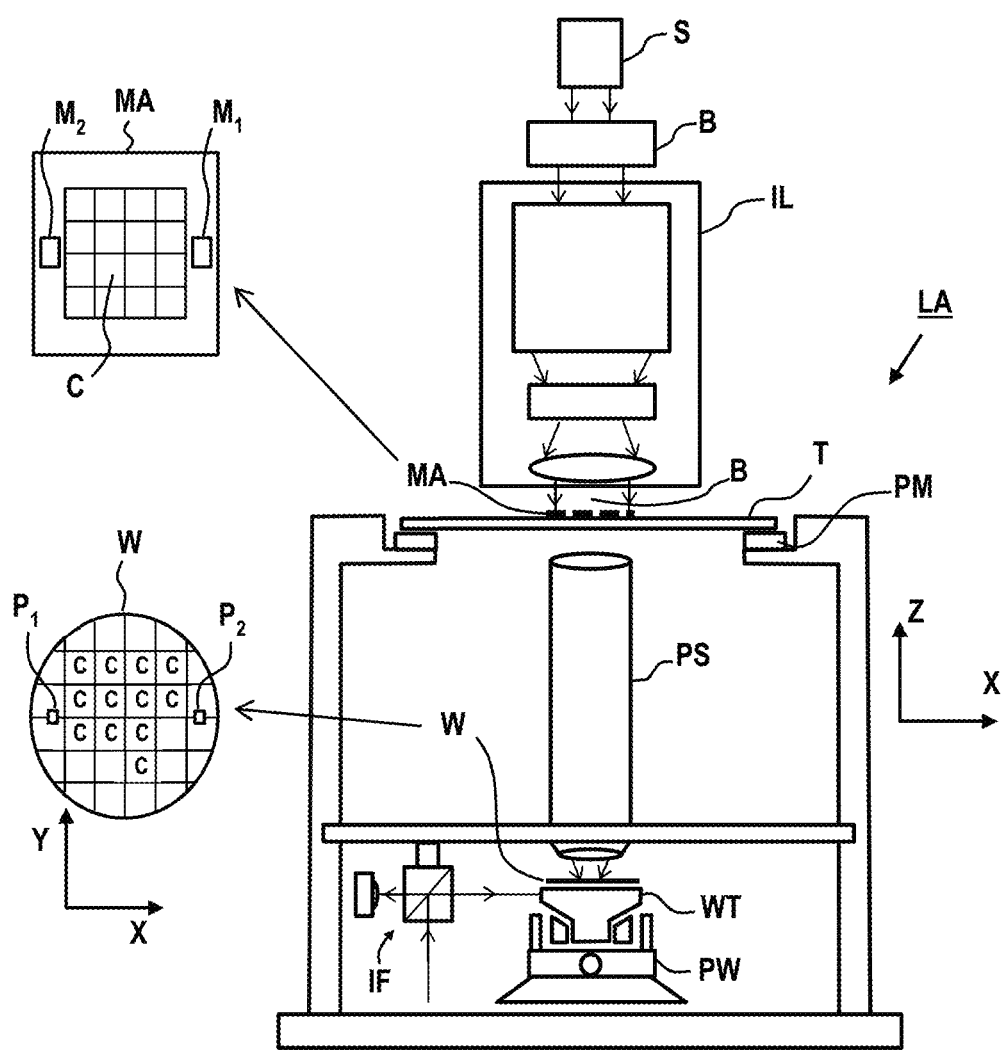
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection systems, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
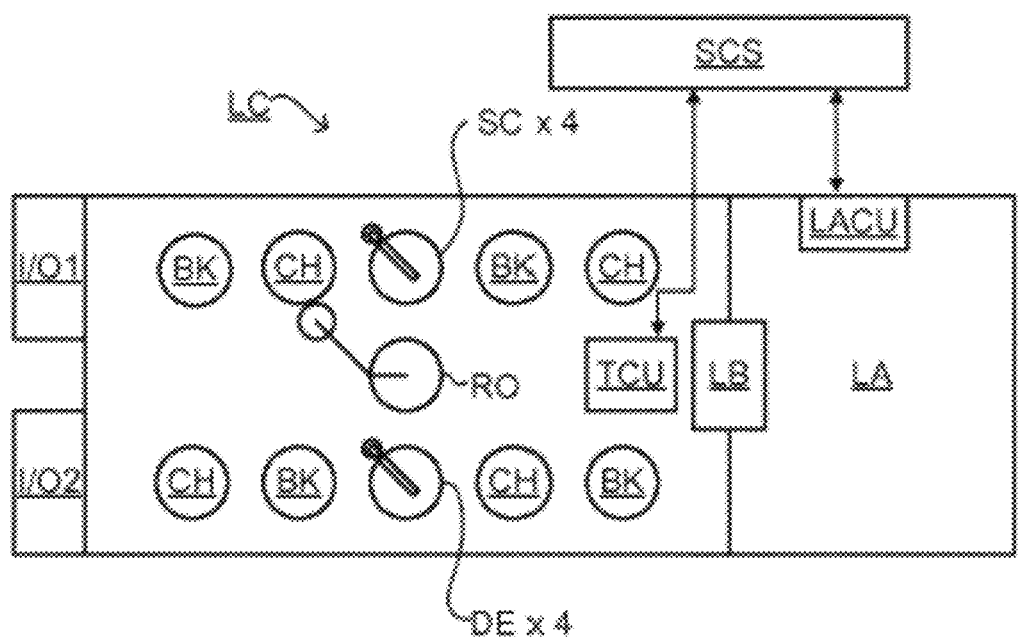
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
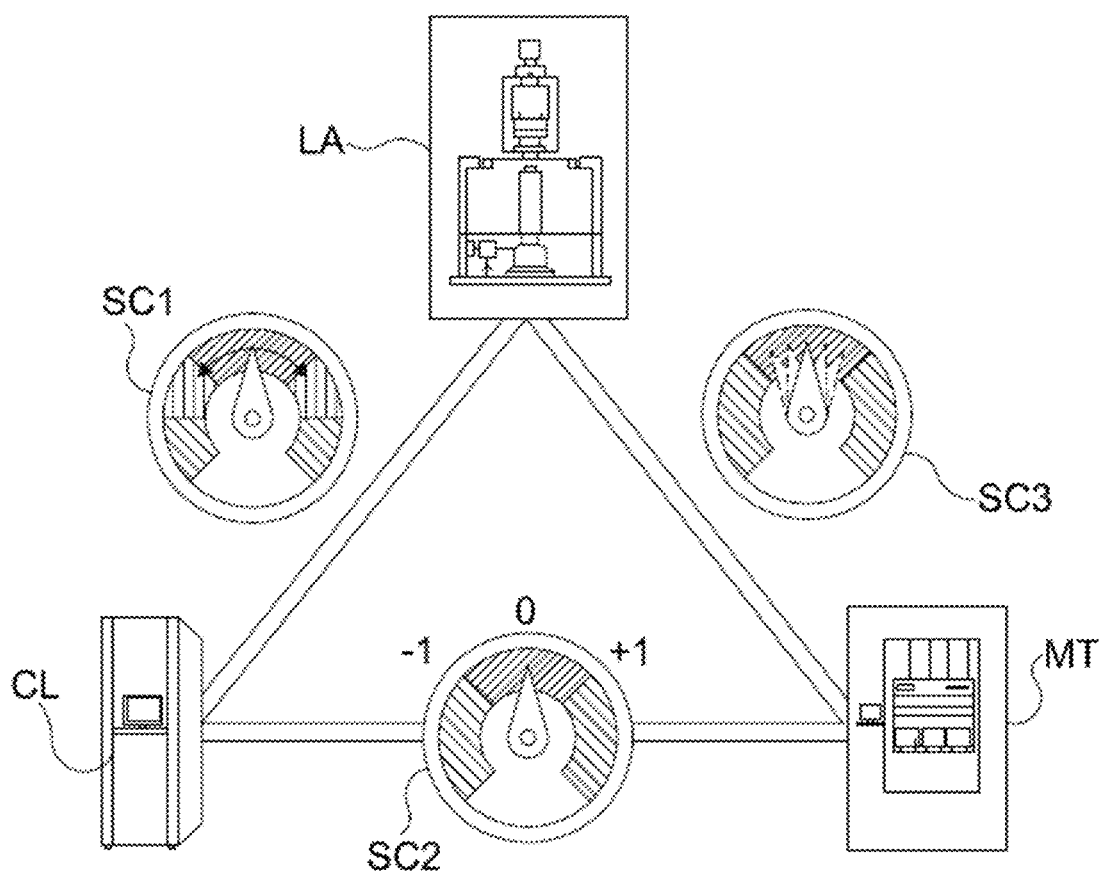
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology too 1s MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred to as pupil based measurements, or by having the sensor in the image plane or a plane conjugate with the image plane, in which case the measurements are usually referred to as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization state. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent applications Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target and measured through asymmetry of the periodic structures may be found in PCT patent application publication no. WO2011/012624A1 or US patent application US20160161863A1, incorporated herein by reference in their entirety.

In yet another embodiment of the scatterometer MT, the scatterometer MT is adapted to block the zeroth order diffracted radiation, and to form images based on first or higher diffracted orders, wherein the images are not resolving the structures present on the wafer. Such apparatus is a dark field metrology apparatus and examples of diffraction based metrology in a dark field setup are described in international patent applications WO2009/078708A1 and WO2009/106279A1, which documents are incorporated herein by reference in their entirety. Also document US2006/0098199A1 is incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement wavelength and/or the measurement optics (in particular the NA of the optics) to be able to capture diffraction orders coming from the metrology targets. As indicated earlier, the diffracted signal may be used to determine shifts between two layers (also referred to as 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time. An example of such multiple target measurements can be found in US patent application US20120123581A1, incorporated herein by reference in its entirety.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US20160161863A1 and not yet published U.S. patent application Ser. No. 15/181,126, incorporated herein by reference in their entirety.

Figure 4:
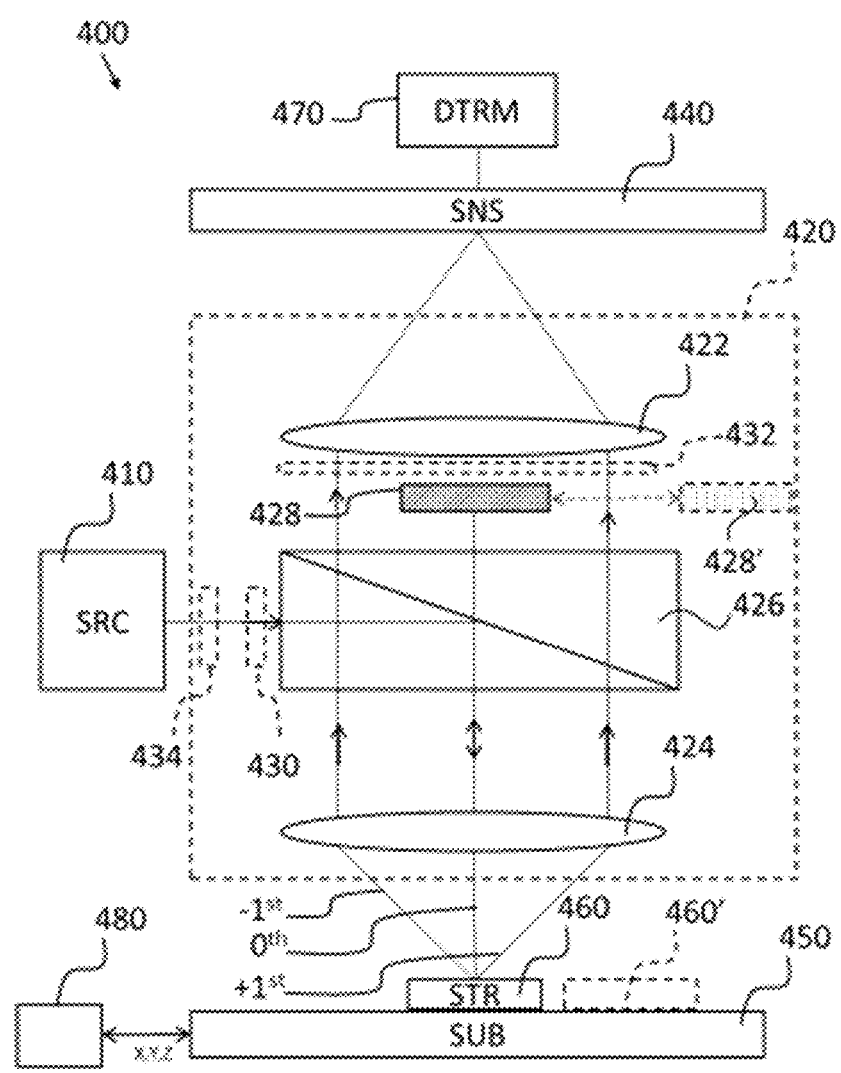
FIG. 4 depicts a schematic representation of an embodiment of a metrology apparatus.

FIG. 4 depicts a schematic representation of an embodiment of a metrology apparatus 400. The metrology apparatus may be metrology apparatus MT of FIG. 3. In this document the terms metrology apparatus is interchangeable with the term inspection apparatus.

Metrology apparatus 400 is for determining a characteristic of interest relating to at least one structure STR, 460 on a substrate SUB, 450. The characteristic of interest may be determining one or more values in relation to the structure 460 on the substrate 450. The characteristic of interest may also be a deviation of the structure 460 on the substrate 450 from an expected structure. The characteristic of interest may also be the presence or absence of a structure 460 on the substrate 450 in comparison to an expected absence or presence of such a structure. The characteristic of interest may also be determining an orientation of the structure 460 on the substrate 450, or determining a tilt of a surface of the structure 460, etc.

The metrology apparatus comprises a sensor SNS, 440 and an optical system 420. The sensor 440 is for detecting a characteristic of radiation being transmitted onto the sensor by the optical system 420. The sensor 440 may comprise an array of pixels that are capable of generating an image of the radiation that impinges on the sensor 440. The sensor 440 may be arranged in an image plane of the optical system or in a conjugate plane to the image plane.

The sensor 440 may be configured to record an image of impinging radiation. The sensor 440 may also be configured to record images having a signal to noise ratio that is being higher than 0.1, or, optionally, higher than 1, or optionally, higher than 10. The sensor may comprise a CCD camera that has an integration time that is shorter than 1 second and, optionally, has an integration time that is shorter than 500 μs. An acquisition time of the sensor 440 may comprises at least the integration time and may also comprise a time interval for signal processing and/or transmitting the obtained image to, for example, a determining system 470. In an embodiment the sensor 440 is operable to acquire an image, i.e. having an acquisition time, until the received signal is above a threshold value. In general, the sensor 440 may be configured to obtain within a maximum amount of time an image with a high enough signal to noise ratio that can be processed by a pattern recognition algorithm to detect in the image a structure that is similar to an expected structure.

The sensor may also be a based on lock-in detection.

The metrology apparatus may also be configured to suppress noise by modulating the radiation generated by the source 410 according to a predefined pattern, and, thus, modulating the radiation that impinges on the structure 460. Subsequently, radiation that is transmitted towards the sensor 440 will, for the largest part, also modulate according to the predefined pattern and it is expect that the optionally present noise is not modulating according to that pattern. Thereby the sensor 440 and/or the determining system 470 is able to distinguish noise from signals that originate from the structure 460 on the substrate by only recording and/or analyzing signals that have the predefined modulation pattern.

The optical system 420 comprises an illumination path and a detection path. The optical system 420 is configured to illuminate the at least one structure with radiation received from the source SRC, 410 via the illumination path. The optical system 420 is configured to receive radiation scattered by the at least one structure 460 and to transmit the received radiation to the sensor 440 via the detection path.

The optical system 420 is configured to image the at least one structure 460 on the substrate 450 onto the sensor 440.

Optionally, the precision and resolution of the optical system 420 and/or of the sensor 440 are such that features of the structure 460 can be distinguished individually in an image that is being formed on the sensor 440 and/or that is recorded by the sensor 440. This may imply that, for example, the arrangement of the optical elements of the optical system 420 is precise enough to image the features onto the sensor 440. This may imply that the optical elements of the optical system 420 are precise enough, e.g., they have a low aberration, such that the features can be distinguished in the image that is recorded by the sensor 440. This may imply that the resolution of the sensor 440 is large enough to distinguish the individual features of the structure 460 on the sensor 440. Thus, there is an appropriate amount of pixels available on the sensor 440 and the pixels of the sensor 440 are sensitive enough. This may also imply that the optical system 420 magnifies or demagnifies the image of the features of the structure 460 in such a way that individual features of the structure are imaged on one or more pixels of the sensor 440.

In an embodiment the optical system 420 comprises a high NA lens, or the optical system 420 in its entirety has a high NA. The resolution of an imaging system, such as the optical system 420, is proportional to the wavelength of the light being observed with the sensor 440 or generated by source 410, and inversional proportional to the size of its objective, as indicated by the Abbe diffraction limit $$d = \frac{\lambda}{2NA},$$

wherein NA is the numerical aperture of the objective and d is the radius of the spot formed by the light focused with the optical system 420. For the purpose of forming an image, the spot size may be such that it is smaller than the individual features which are to imaged. In a preferred embodiment, the optical system 420 comprises a high NA lens. In an embodiment, the NA is 0.7. In an embodiment, the NA is 0.8. In an embodiment, the NA is 0.9. In an embodiment, the NA is higher than 0.95. In an embodiment, there are specific materials present between the optical system 420 and the structure 460, the NA is higher than 1. Examples of the specific materials are gasses that may increase an NA or a fluid, such as water.

It is to be noted that a difference may be distinguished between the illumination numerical aperture and a detection numerical aperture. The illumination numerical aperture is the numerical aperture of the beam of illumination radiation that impinges on the structure 460 on the substrate 450. This illumination numerical aperture may be significantly smaller than the numerical aperture that the lens 424 of the optical system 420 that is closest to the structure 460 supports because the illumination beam may only use a portion of the lens 424 of the optical system 420 that is closest to the structure. In an embodiment, the illumination numerical aperture is smaller than 0.5, or optionally, smaller than 0.2, or optionally, smaller than 0.1, or, optionally, smaller than 0.05. In an embodiment, the detection numerical aperture is as large as possible. The detection numerical aperture defines up till which diffraction angle higher diffraction angles can be captured by the optical system 420 and can be transmitted towards the sensor 440. In previous paragraphs, the discussed numerical aperture (NA) relates to the detection numerical aperture and thus to a large extend to the numerical aperture of the lens 424 of the optical system that is closest to the structure 460.

The metrology apparatus 400 is configured to prevent a transmission of radiation of the $0^{th}$ diffraction order of the scattered radiation towards the sensor 440. As indicated in FIG. 4, a ray of radiation impinges on the structure 460 at a perpendicular angle with respect to the substrate 450. The structure 460 scatters the radiation resulting in a zeroth diffraction order into a direction towards the optical system 420 at an angle perpendicular to the substrate 450 and a plus and minus first diffraction order into the direction of the optical system 420 and both having an angle with respect to the zeroth diffraction order. Additional higher diffraction orders may travel into a direction away from the substrate 450. For clarity these higher diffraction orders are not drawn. In the optical system a blocking element 428 may be present that blocks the zeroth diffraction order and prevents that the radiation of the zeroth diffraction order travels towards the sensor 440

The optical system may operate in a first operational mode and in a second operational mode. In the first operation mode the blocking element is controllable in the a first position where the blocking element blocks the transmission of the $0^{th}$ diffraction order of the scattered radiation towards the sensor 440. In the second operational mode the blocking element is at another (second) location where it does not block the transmission of the $0^{th}$ order towards the sensor 440.

Optionally, the blocking element 428 is present in a pupil plane or in a conjugate plane to the pupil plane. An important effect of blocking the zeroth order is that the dc-level, which would be present in the image on the sensor 440 if the zeroth order is not blocked, is significantly reduced and thereby the image has a better contrast.

In the example of FIG. 4 the illumination path and the detection path partially overlap. The optical system 420 has a beam splitting element 426 that reflects radiation originating from the source 410 towards the structure 460 on the substrate 450 and that allows the transmission of radiation scattered by the structure 460 towards the sensor 440.

The optical system 420 may comprise one or more lenses 422, 424. The one or more lenses 422, 424 are configured to focus the radiation from the source 410 in a spot on the structure 460 and wherein the one or more lenses 422, 424 are configured to transmit the radiation scattered by the at least one structure 460 towards the sensor 440. Optionally, the one or more lenses 422, 424 are arranged to create an image of the at least one structure 460 on the sensor 440.

The lenses should have a relatively high quality in order to image the individual features of the structure 460 on the sensor. As indicated previously this may imply that the one or more lenses (individually or as a combination of lenses) have an aberration that is smaller than $\lambda/20$. Optionally, the aberration of the individual lenses or the combination of lenses is smaller than $\lambda/100$, or, optionally smaller than $\lambda/500$, or, optionally smaller than $\lambda/1000$.

It is to be noted that the example of the optical system 420 comprises lenses 422, 424. Embodiments of such optical system 420 are not limited to the use of lenses 422, 424. The optical system 420 may also use (curved) mirrors. Mirrors can be used instead of lenses. Also a combination of one or more lenses and one or more mirrors can be used as well.

The optical system may comprise an optics errors measuring unit, not shown in the figures. In an embodiment, the optics errors measuring unit may be an aberration sensor, such as a Shack-Hartmann sensor. Detected aberration may be used by the determining system 470 to correct an image that is recorded by sensor 440 for the detected aberration.

The metrology system 400 may also comprise a determining system DTRM, 470. The determining system 470 is configured to receive a signal from the sensor 440 and the signal represents an image that is recorded by the sensor. The determining system 470 determines an overlay value on basis of a displacement between features in a first layer of the substrate 450 and features in a second layer of the substrate 450. The displacement between the features is determined in the image that is received from the sensor 440. If the overlay value deviates from an expected value, the deviation is termed the overlay error. Often the term overlay is used to indicated overlay error.

Metrology system 400 may also comprise one or more actuators 480 that are directly or indirectly coupled to the substrate 450 and which allow the movement of the substrate with respect the position where illumination radiation impinges on the substrate. The movement is, for example, in the x, y and z direction. The substrate may be a semiconductor wafer and the substrate may be provided on a wafer table. The position of the wafer table may be controllable in x, y, z direction and the wafer table may also be operable to rotate around a central axis.

Metrology system 400 may, if actuators 480 are present, be operable to illuminate the structure 460 with a spot of radiation while the substrate 450 with structure 460 moves with respect to the position of the spot of radiation. It is not necessary that (only) the substrate moves, it may also be that the optical system with sensor 440 and/or source 410 moves with respect to the substrate. During the moving of the substrate 450 with structure 460, the spot of radiation illuminates different parts of the substrate 450 and, thus, also different parts of the structure 460. During the moving, the sensor with determining system 470 may obtain or record different images of the structure. The substrate and the different images may be used to reconstruct an overall image of the structure and/or may be used to directly determine values for the characteristics of interest (such as, for example, overlay values).

In an embodiment of the optical system 420, the blocking element 428 may be moveable in dependence of a control signal. For example, the blocking element 428 may be moved towards a second position 428' by means of a translating or rotating movement. At the second position 428' the blocking element is not anymore blocking the $0^{th}$ diffraction order and then a bright field image is created on the sensor 440. This embodiment enables a metrology apparatus 400 that is capable of switching between dark field and bright field imaging.

In FIG. 4 it has been shown that the spot of radiation impinges on a single structure. In specific embodiments, two or more structures 460, 460' may be available on the substrate 450 at positions that are close to each other. The two or more structures 460, 460' may be adjacent to each other, optionally with a small distance in between them. The optical system 420 may be configured to illuminate two or more structures 460, 460' simultaneously with a single spot of radiation. Consequently, the image recorded by the sensor 440 may also comprise an image of the two or more structure 460, 460' and characteristics of interest can be determined on basis of the recorded image for both structures. For example, the two or more structure 460, 460' have features in different layers and thereby one can determine, for example, overlay values that relates to different pairs of layers. This embodiment enables a faster acquisition of characteristics of interest because only a single acquisition of an image is needed to determine multiple characteristics of interest.

Figure 6:
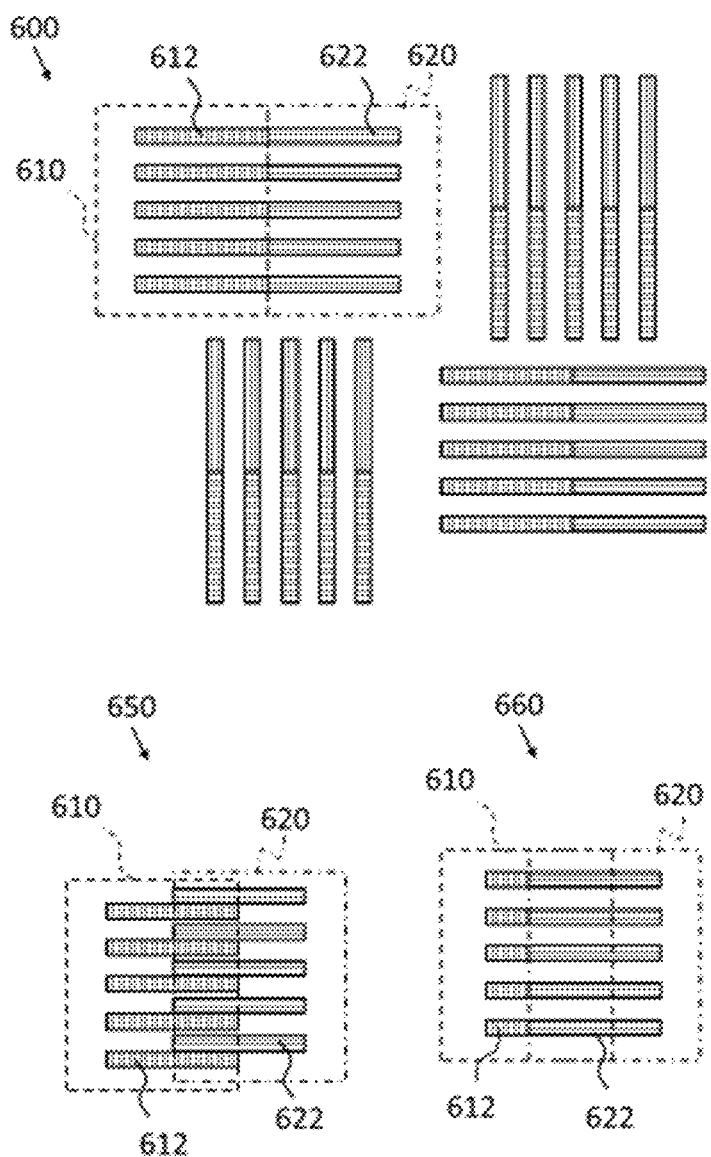
FIG. 6 depicts a number of schematic representations of structures that may be manufactured on a substrate and that may be inspected by the embodiments of the metrology apparatus.
Figure 7:
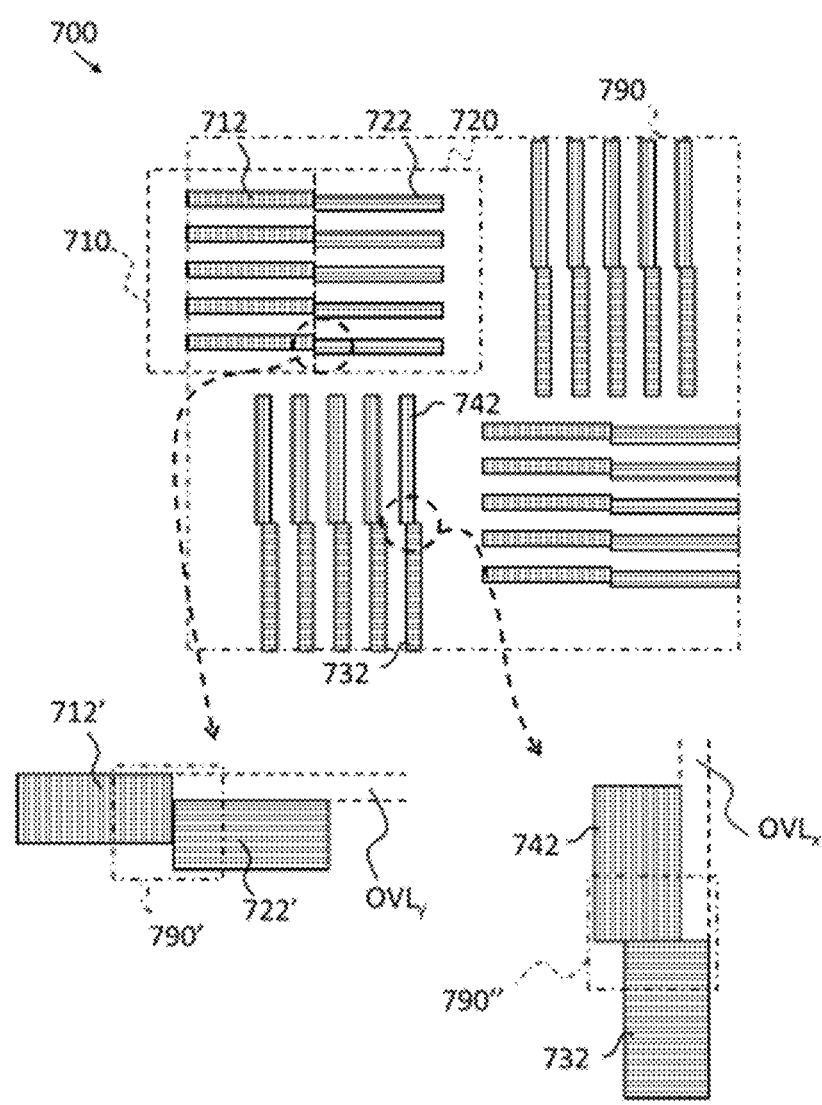
FIG. 7 depicts an embodiment of images that may be obtained by a sensor of a metrology apparatus.

FIGS. 6 and 7 will be used to explain how the overlay value is determined. The structure 460 on the substrate 450 may be manufactured on the substrate 450 by means of, for example, the lithographic apparatus of FIG. 1. In the lithographic apparatus a patterning device MA is used to print the structure 460. The patterning device MA may comprise a structure that is intended to print structure 460 on the substrate 450. In practical embodiments a first patterning device is used or a few patterning devices are used to print features in a first layer and a second patterning device is used or a few patterning devices are used to print features in a second layer. In practical embodiments, the first, second or additional patterning devices that are being used do not comprise exact copies of portions of structure 600, but comprise structures that result under predefined manufacturing conditions in portions of structure 600.

Thus FIG. 6 represents a structure 600 that is present on the substrate if it is being manufactured under ideal manufacturing circumstances and, thus, if no overlay error is being present. The structure 600 comprises first structure 612 in a first layer and second structure 622 in a second layer. All structures in structure 600 that have the same hatching are manufactured in the same layer. There are horizontally oriented structures and vertically oriented structured. For sake of clarity a first discussion only focuses on the horizontally oriented structures. It is further noted that horizontally and vertically are defined with respect to the orientation of the figure and that, in practical embodiments, the presented pattern may be present in a rotated, translated and/or mirrored pattern on the substrate 450.

Structure 600 comprises a first area 610 and a second area 620. In the first area 610 a repetitive pattern of first features 612 is present. In the second area 620 a repetitive pattern of second features 622 is present. In the example of structure 600, the first area and the second area do not overlap and are adjacent to each other. As present at 650 or 660, the first area and the second may partially overlap.

The pitch of the first feature 612 and the pitch of the second features 622 are substantially equal to each other. However, it is to be noted that this is not necessary. As long as, as will be discussed hereinafter, the determining system 470 is able to determine an overlay value from the image being recorded by the sensor 440, varying pitches can be used as well. The pitch between the features 612, 622 also influences the angle at which higher diffraction orders are scattered and, therefore, the used pitch or pitches must also be chosen wisely such that as most as possible the higher diffraction orders, or at least as most as possible one higher diffraction order, is captured by the optical system 420. Note that the angle at which the higher orders are present also depends on the wavelength of the radiation that is used to illuminate the structure 460 and, therefore, the combination between the wavelength and the pitch must be chosen wisely to enable the creation of an image on the sensor 440.

In practical situations, structure 600 is not exactly manufactured on the wafer as indicated in FIG. 6. In practical embodiments, on the substrate 450, structure 600 may look like the structure presented in the upper half of FIG. 7. An image 700 is recorded by sensor 440 of metrology apparatus 400. The image is similar to the presented structures at the upper half of FIG. 7. As can already be seen in image 700, the first features 712 are displaced with respect to the second features 722, in particular, when being compared to the ideal situation of structure 600. For the horizontally oriented features 712, 722 a portion of image 700 is enlarged at the bottom left side of FIG. 7. There it can be seen in more detail that first feature 712' is displaced with respect to second feature 722' over a distance $OVL_y$. $OVL_y$ is the overlay value in the y-direction (wherein x and y-direction are defined with respect to the orientation of FIG. 7). Image 700 also shows that there is a displacement between the vertically oriented features 742, 732. At the bottom right side of FIG. 7 one can see the displacement is indicated with $OVL_x$ and the distance $OVL_x$ is the overlay value in the x-direction.

Although it has been suggested by FIG. 7 that one can determine an overlay value based on analyzing a displacement of e.g. two opposite horizontally oriented features 712, 722, 712', 722' or two vertically oriented features 742, 732 that are adjacent to each other, in practical embodiments more pairs of adjacent features having the same orientation are used. For example, for each pair of horizontally oriented features an overlay value can be determined and the determined values can be averaged. For example, it is also possible to determine a first kind of wave pattern that is in phase with horizontally features in a first layer and determine a second kind of wave pattern that is in phase the horizontally features in a second layer and use the difference between the phases of the first kind of wave pattern and the second kind of wave pattern as a basis for the overlay value.

Because overlay values of a few nanometers must be measured it is important that the optical system 420 of metrology apparatus 400 has a very high precisions and accuracy with respect to the imaging of the structure 460 on the sensor 440. About no deviations from an ideal optical system can be accepted. As such, aberration deviations of the lenses 422, 424 of the optical system 420 and also to the optical system 420 as a whole are preferably small.

The determining system 470 receives the image that is recorded by the sensor 440. This image is, for example, image 700. The determining system 470 may also have knowledge about the structure that is expected in the image (e.g. the ideal structure 600 of FIG. 6) and by means of, for example, pattern recognition this structure is detected in image 700. The pattern recognition technology applied by the determining system 470 may be such that it is capable to detect a structure similar to the ideal structure, e.g. structure 600 of FIG. 6, in an image that comprises a relatively large amount of noise, or in an image in which the signal noise ratio is relatively small, or in an image in which the dynamic range is relatively small. The determining system 470 may also have knowledge where a transition of a first feature in a first layer to a second feature in a second layer may be expected. Based on this knowledge such a transition may be recognized in image 700 and the overlay values may be determined at those transitions. The determining system 470 may, for example, implement an edge detection system for detecting edges of, for example, structures 712', 722', 742, 732.

When returning to FIG. 4, other optional features may be present in the optical system 420. The optical system 420 may comprise a wavelength filter 434. By way of example the wavelength filter 434 is drawn in between the source 410 and the beam splitting element 426 and it is to be noted that the wavelength filter 434 may also be arranged at another location. It is expected that the wavelength filter 434 is at least present in the illumination path of the optical system 420. The wavelength filter 434 is configured to only transmit radiation of a particular wavelength or within a particular wavelength range. In a further embodiment, the operation of the wavelength filter 434 may be controllable in dependence of a wavelength control signal. It is also to be noted that the source 410 may also have a similar wavelength filter. In another embodiment, the wavelength filter 434 may comprise a plurality of filters of which the combination of filters allow the transmission of two or more wavelengths that are spaced apart. Specific materials are opaque for specific wavelengths. Therefore, the selection of the wavelengths that are used to illuminate the structure 460 (which are the wavelengths that are transmitted through the wavelength filter 434) strongly depends on the materials that are used in the structure 460 and whether the illumination radiation has to be transferred through specific layers of the structure 460. The wavelength filter 434 may be configured to only allow a narrow band of wavelengths to be transmitted through the wavelength filter 434, for example, the width of the narrow band of wavelengths is smaller than 20 nm, or smaller than 10 nm, or smaller than 5 nm.

It may be advantageous to illuminate the structure with a certain wavelength or with radiation within a certain wavelength range. The materials of the substrate 450, and as such also the features of the structure 460, may strongly influence the scattering of the impinging radiation. By selecting a specific wavelength or by selecting certain wavelengths one may obtain a better image on the sensor 440. Additionally, the wavelength of the illumination radiation may be selected such that, giving that the structure 460 has a repetitive structure with a given pitch, at least one higher diffraction order can be captured by the optical system 420 (e.g. by front lens 424) for transmission towards the sensor 440. In other words, the illumination wavelength and the pitch of the repetitive structure are tuned to each other (and are tuned with respect to the numerical aperture (NA) of the detection path of the optical system 420).

In a further embodiment, the optical system 420 comprises a first polarizer 430 being arranged in the illumination path of the optical system 420. The first polarizer 430 is configured to allow the transmission of radiation having a certain polarization. The first polarizer 430 may also be a controllable polarizer of which the transmittable polarization can be controlled in dependence of a polarization control signal.

In an additional embodiment, the optical system 420 comprises a second polarizer 432 being arranged in the detection path of the optical system 420. The second polarizer 432 is configured to allow the transmission of radiation having a certain polarization. The second polarizer 432 may also be a controllable polarizer of which the transmittable polarization can be controlled in dependence of a further polarization control signal.

It may be advantageous to control the polarization of the radiation that impinges on the structure and to control which polarization of the scattered radiation is transmitted to the sensor. The materials of the substrate 450, and as such also of the structure 460, may scatter radiation of different polarizations in different ways. The structure 460 and also the materials of the structure 460 and the substrate 450 may change the polarization of the radiation that impinges on the structure 460 and that is being scattered. Thereby one can obtain a better image, e.g. with a higher contrast, on the sensor 440 by illuminating with a certain polarization and only allowing the transmission of the same or another specific polarization towards the sensor. It has also been observed that a selection of specific wavelengths of radiation in combination with specific polarizations may result in a better image on the sensor 440. In an embodiment the structure 460 is illuminated by radiation having a first polarization as determined by the first polarizer 430. With specific structures 460 it is known that the information that relates, for example, to overlay is present in radiation that has a polarization direction that is perpendicular to the first polarization. Then the second polarizer 432 only allows the transmission of radiation having a polarization direction perpendicular to the polarization direction that is transmittable through the first polarizer 430. In an embodiment, as shown in FIG. 4 and if at least the second polarizer 432 is present, only higher order diffraction radiation of a certain polarization direction impinges on the sensor 440 and the determining of the characteristic of the structure 460 is only based on one or more higher order diffraction radiation of a certain polarization direction. In an embodiment, the settings of the first polarizer 430 and/or of the second polarizer 432 are optimized for the specific structures 460 that are present on the substrate 450 to obtain a better image, e.g. with a higher contrast, on the sensor 440. For example, if the specific structures 460 has repetitive lines in a certain direction than it may be that illumination radiation with a certain polarization is maximally scattered (optionally, maximally scattered into the higher diffraction orders) and that only transmitting a specific (other) polarization of the scattered radiation towards the sensor may result in an image with most contrast and/or a highest image quality.

FIG. 4 also shows the source 410. The source 410 may be part of the metrology apparatus 400 but may also be a separate source that provides radiation to the metrology apparatus 400 by means of, for example, glass fibers and/or another type of light guide. The source is configured to generate radiation having one or more wavelengths in a wavelength range from 200 nm to 2000 nm, or optionally, in a range from 300 nm to 1000 nm, or, optionally, in a range from 400 nm to 900 nm, or, optionally, in a range from 400 nm to 700 nm. The source may be configured to generate radiation in the near-infrared spectral range, for example, from 750 nm to 1400 nm. The source may be configured to generate radiation in the visible wavelength range, for example, from 380 nm to 750 nm. For example, the source may be configured to generation radiation in at least one of the Ultraviolet A, B or C spectral ranges, respectively, from 315 nm to 400 nm, from 280 nm to 315 nm, from 100 nm to 280 nm. As indicated above, radiation of specific wavelengths may be beneficial and as such the wavelength or the wavelengths of the radiation may be optimized for obtaining an image of a high enough quality on the sensor 440. The source may also be configured to emit radiation at two or more wavelengths that are spaced apart.

The amount of power being present in the radiation that illuminates the structure 460 determines for a large amount the time required for recording an image by the sensor. The more power present in the radiation that illuminates the structure 460, the more radiation impinges on the sensor and the shorter the integration time is that the sensor 440 needs to record an image. As such, the source 410 is configured to generate in use a radiation that has a power larger than 50 Watt, or, optionally, larger than 150 Watt, or, optionally, larger than 250 Watt, or, optionally, larger than 1000 Watt.

In an embodiment, the metrology apparatus 400 may use plasma-based photon sources, for example laser driven photon sources (LDPS), otherwise known as laser-driven light sources, as these offer high brightness. Plasmas are generated in a gaseous medium by the application of energy through electric discharge, and laser energy. The spectral distribution of the radiation may be broadband or narrowband in nature, and wavelengths may be in the near infrared, visible and/or ultraviolet (UV) bands. Published patent application US2011204265 and international patent application WO2016030485 disclose plasma-based light sources including laser-driven photon sources, which documents are incorporated herein by reference in their entirety.

Other examples of sources are a coherent white light laser, a coherent discrete laser (which emits within a small wavelength range), a coherent continuous controllable laser, a coherent optical parametric oscillator (OPO), an incoherent laser driven light source (as discussed, for example, above), and/or an incoherent photodiode. It is to be noted that partially incoherent sources may be used as well.

It is to be noted that the source 410 may also be a controllable source that is capable of emitting radiation of a controllable wavelength within a wavelength range in dependence of a source control signal.

The source 410 may emit radiation in a relatively wide wavelength range, for example, in a wavelength range that is wider than 50 nm, or, optionally, in a wavelength range that is wider than 100 nm, or, optionally, in a wavelength range that is wider than 200 nm. The source 410 may also be configured to emit in a relatively narrow wavelength range, wherein the width of the narrow wavelength range is, for example, smaller than 20 nm, or smaller than 10 nm, or smaller than 5 nm.

In FIG. 4 only one illumination radiation ray is drawn. Schematically seen this single radiation ray is a central axis of a radiation beam that is transmitted and focused in a spot of a certain size on the structure 460. As such, the drawn $-1^{st}$, $+1^{st}$ and $0^{th}$ diffraction orders are also beams of radiation of which only a schematic central axis is drawn. In the context of FIG. 4, the central axis of the illumination radiation beam impinges on the structure 460 at a direction substantially perpendicular to the top surface of the substrate.

A metrology recipe can be used that specifies one or more parameters of the measurement using an embodiment of the metrology apparatus as discussed in this application. In an embodiment, the term "metrology recipe" includes one or more parameters of the measurement/of the metrology apparatus itself, one or more parameters of a structure, e.g. structure 460, measured, or both.

In this context, a structure 460 measured (also referred to as a "target" or "target structure") may be a pattern that is optically measured, e.g., whose diffraction is measured or which is imaged on, for example, sensor 440. The pattern measured may be a pattern specially designed or selected for measurement purposes. Multiple copies of a target may be placed on many places on the substrate 450. For example, a metrology recipe may be used to measure overlay. In an embodiment, a metrology recipe may be used to measure another process parameter (e.g., dose, focus, CD, etc.). In an embodiment, a metrology recipe may be used for measuring alignment of a layer of a pattern being imaged against an existing pattern on a substrate; for example, a metrology recipe may be used to align the patterning device to the substrate, by measuring a relative position of the substrate.

In an embodiment, if the metrology recipe comprises one or more parameters of the measurement/of the metrology apparatus 400 itself, the one or more parameters of the measurement itself can include one or more parameters relating to an illumination beam and/or metrology apparatus used to make the measurement. For example, the one or more parameters of the measurement itself may include a wavelength of illumination radiation, and/or a polarization of illumination radiation, and/or illumination radiation intensity distribution, and/or an illumination angle (e.g., incident angle, azimuth angle, etc.) relative to the substrate 450 of illumination radiation, and/or the relative orientation relative to a structure 460 on the substrate 450 of diffracted/ scattered radiation, and/or the number of measured points or instances of the structure 460/target, and/or the locations of instances of the structure 460/target measured on the substrate 450. The one or more parameters of the measurement itself may include one or more parameters of the metrology apparatus used in the measurement, which can include detector sensitivity, numerical aperture, etc.

In an embodiment, if the metrology recipe comprises one or more parameters of a structure 460 measured, the one or more parameters of the structure 460 measured may include one or more geometric characteristics (such as a shape of at least part of the structure 460, and/or orientation of at least part of the structure 460, and/or a pitch of at least part of the structure 460 (e.g., a pitch of a grating including the pitch of an upper grating in an upper layer, of a lower grating and/or the pitch of the lower grating), and/or a size (e.g., CD) of at least part of the structure 460 (e.g., the CD of a feature of a grating, including that of a feature of the upper grating and/or the lower grating), and/or a segmentation of a feature of the structure 460 (e.g., a division of a feature of a grating into sub-structures), and/or a length of a grating or of a feature of the grating), and/or a materials property (e.g., refractive index, extinction coefficient, material type, etc.) of at least part of the structure 460, and/or an identification of the structure 460 (e.g., distinguishing a pattern being from another pattern), etc.

A metrology recipe may be expressed in a form like $(r_1, r_2, r_3, \ldots, r_n; t_1, t_2, t_3, \ldots, t_m)$, where $r_i$ are one or more parameters of the measurement/of the metrology apparatus 400 and $t_j$ are one or more parameters of one or more structure 460 measured. As will be appreciated, n and m can be 1. Further, the metrology recipe does not need to have both one or more parameters of the measurement and one or more parameters of one or more patterns measured; it can have just one or more parameters of the measurement or have just one or more parameters of one or more patterns measured.

In order to create a relatively good image on the sensor 440, the metrology apparatus 400 may focus the illumination radiation on the structure 460 on the substrate 450. A focusing sub-system may be provided in metrology apparatus 400. In an embodiment, the metrology apparatus 400 may be configured to focus at different depths within the structure 460. The optical system 420 may be arranged to move, for example, lens 424 to obtain a specific focus. The one or more actuators 480 that may move the substrate 450 in different directions may move the substrate 450 with structure 460 up and down to focus the illumination radiation at different depths in the structure 460. The metrology apparatus 400 may be configured to record with the sensor 440 different images when the metrology apparatus 400 is focused at different depths within the structure 460. The different images may be used by the determining system 470 to determine the characteristic of interest of the structure 460. The determining system 470 may also select one or more images of the different images that are most suitable for determining the characteristic of interest. For example, the one or more images may be selected on basis of a requirement that the contrast must be above a predefined level.

Figure 5:
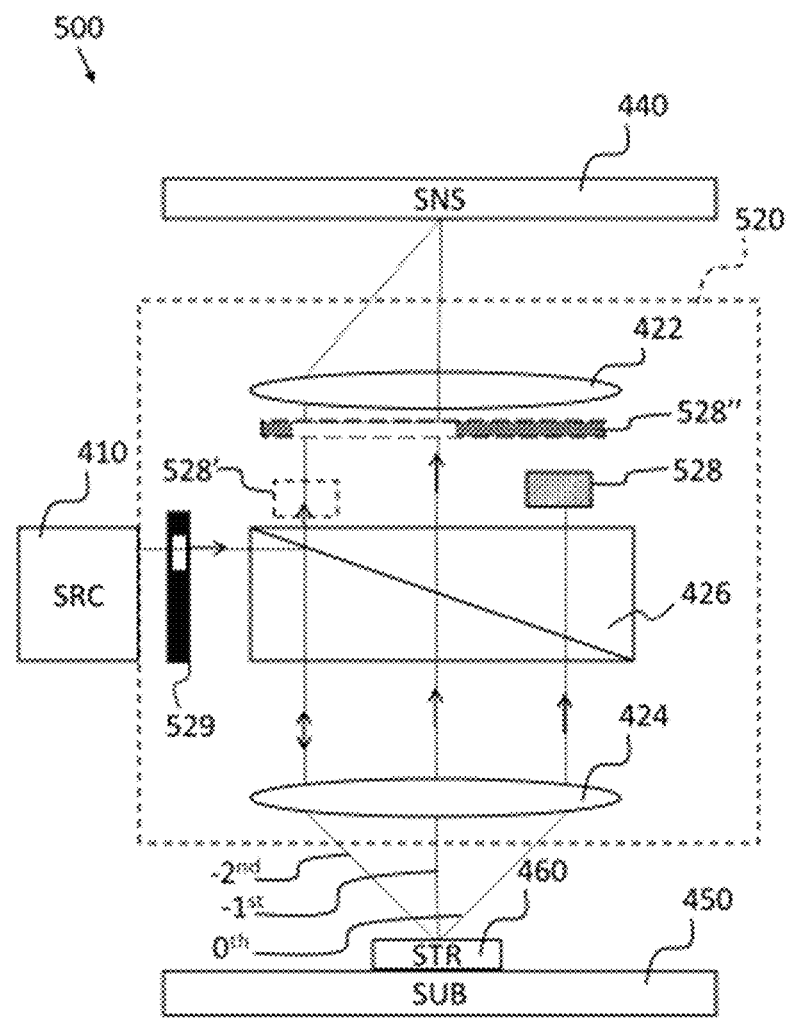
FIG. 5 depicts a schematic representation of a second embodiment of a metrology apparatus.

FIG. 5 depicts a schematic representation of another embodiment of a metrology apparatus 500. Metrology apparatus 500 is similar to metrology apparatus 400 and comprises similar or equal embodiments. Differences will be discussed hereinafter.

In metrology apparatus 500 the illumination radiation beam does not impinge on the structure 460 at an angle that is substantially perpendicular to the structure 460, but impinges on a certain angle with respect to a normal of the surface of the substrate 450. In the example of FIG. 5 this may result in a $-1^{st}$ diffraction order that follows a path that is about perpendicular to the top surface of the substrate 450, and a $-2^{nd}$ and $0^{th}$ diffraction order that each have an angle with respect to the normal. In such a configuration, the blocking element 528 must be positioned at another location within the optical system 520 such that the $0^{th}$ diffraction order is not transmitted towards the sensor 440. Optionally, further blocking elements 528' may be present to block the $-2^{nd}$ diffraction order as well. The optical system 520 may also have an circular aperture in the detection path and blocking elements 528, 528' may be a cross sectional view of the element in which the aperture is created.

An illumination radiation beam that does not impinge perpendicular on the structure 460 may be obtained by displacing the source 410 with respect to a central axis of the illumination path of the optical system 520. If the source emits a relatively wide radiation beam, one may place an illumination pupil 529 in the radiation beam that originates from the source and that has an aperture at a location that is away from the central axis of the illumination path of the optical system 520. In an embodiment, the illumination pupil 529 may be controllable wherein the position of the aperture with respect to the central axis of the illumination path of the optical system 520 can be controlled in dependence of an illumination pupil control signal.

Figure 12:
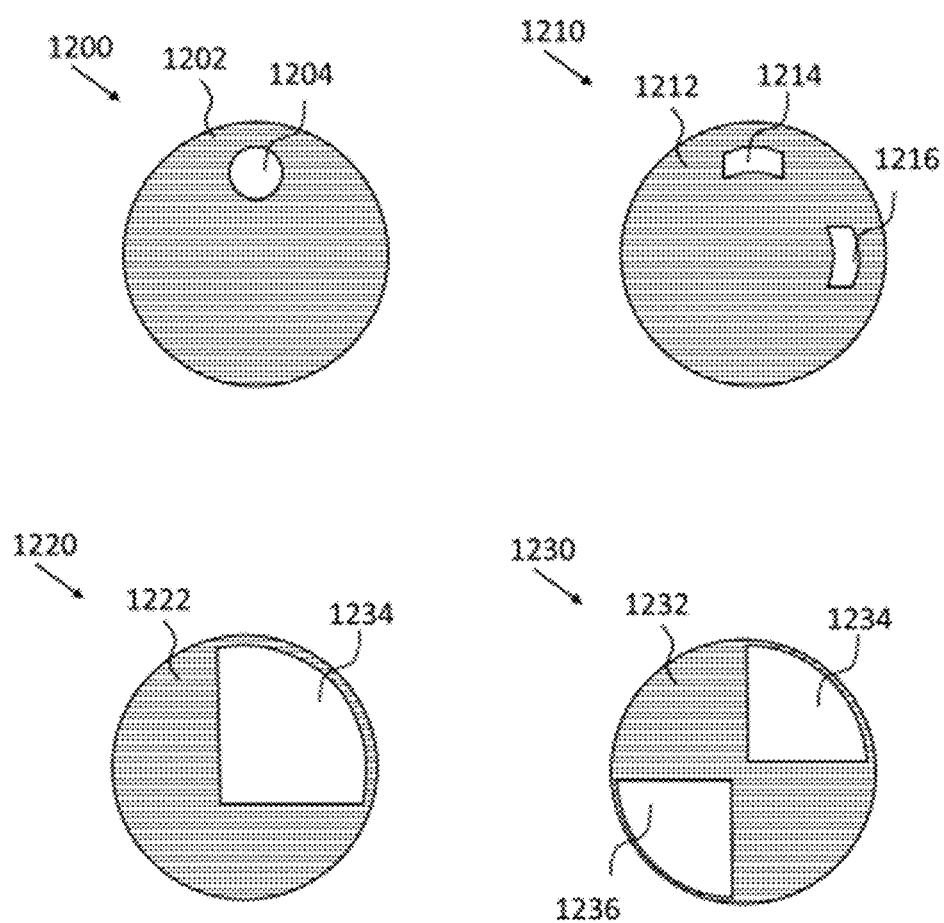
FIG. 12 depicts schematic representations of illumination pupils and detection pupils for the metrology apparatus.

FIG. 12 schematically shows exemplary top views of illumination pupils 1200 and 1210 that can be used at the position of illumination pupil 529. In illumination pupil 1200 an opaque plate 1202 has a hole 1204 at an off-center position. If a center of the opaque plate 1202 coincides with the optical axis of the illumination path, the illumination radiation will be a radiation beam that has, for example, the drawn illumination light ray of FIG. 5 as a center. Of course the illumination pupil 1200 may also have two holes 1204 in a similar configuration as shown in illumination pupil 1210.

Illumination pupil 1210 comprises an opaque plate 1212 in which two holes 1214, 1216 are made with a shape as shown in FIG. 12. These specific holes 1214, 1216 have, with respect to a center of the illumination pupil 1210, an angular offset of 90 degrees. This allows the transmission of two illumination beams that do not coincide with the central optical axis of the illumination path. This results in the illumination of the structure 460 from two different orthogonal directions and may have the advantage that overlay values in two dimensions may be measured in one measurement acquisition.

In FIG. 5 another type of pupil, detection pupil 528", has been schematically drawn along the detection path of metrology apparatus 500. For example, detection pupil 528" may be provided in a pupil plane or a plane conjugate with the pupil plane. The detection pupil 528" may be arranged to allow the transmission of one or more higher diffraction order of the scattered radiation and may be arranged to block the transmission of the $0^{th}$ diffraction order. The detection pupil 528" may be used instead of or in addition to the blocking element 528. For example, in FIG. 12 an exemplary top view of an detection pupil 1220 is shown that comprises an opaque plate 1222 and a hole 1234 through which, if used for example in the configuration of FIG. 5, higher diffraction orders can be transmitted and the $0^{th}$ order can be blocked. An alternative configuration is shown for detection pupil 1230 which comprises an opaque plate 1232 and two holes 1234 and 1236. It is to be noted that the skilled person may find alternative embodiments that have, in combination with for example a specific illumination pupil, a specific advantage with respect to allowing the transmission of certain higher diffraction orders and blocking the 0$^{th}$ diffraction order.

The illumination pupil 529 or detection pupil 528" may also be formed by flexible and/or controllable types of pupils. Examples are provided in FIGS. 13(*a*) and 13(*b*) and FIGS. 14(*a*) and 14(*b*). The examples of FIGS. 13(*a*), 13(*b*), 14(*a*) and 14(*b*) may be used in the examples of the metrology apparatus 400, 500 e.g. in the illumination path and/or in the detection path. Possible locations in the apparatus are schematically indicated by illumination pupil 529 in metrology apparatus 500 or by the detection pupil 528" in metrology apparatus 500. It is to be noted that the examples of FIGS. 13(*a*), 13(*b*) and 14(*a*) are based on transmission of radiation and as such the indicated positions in FIG. 5 are directly suitable for these examples. The example of FIG. 14(*b*) is based on reflection and, as such, the metrology apparatus must be modified to have an illumination and/or detection path which is reflected at the illumination and/or detection pupil. All example of FIGS. 13(*a*), 13(*b*), 14(*a*) and 14(*b*) are examples of flexible pupil in which certain elements are controllable to obtain a specific shape of the pupil. The examples allow the creation of different specific shapes that may be selected in dependence of the requirements of a specific measurement.

FIG. 13(*a*) schematically shows a flexible pupil arrangement 1300 in which there are two wheels 1300, 1320 with differently shaped apertures 1311 . . . 1314, 1321 . . . 1324 in the opaque material of the wheels. In use, wheel 1320 is located in front of or behind wheel 1310 at a position that is indicated with dashed circle 1320'. The wheels 1300, 1320 can be rotated in dependence of a control signal. By selecting a specific position for the first wheel 1310 and a specific position for the second wheel, a specifically shaped aperture is created by the flexible pupil arrangement 1300. In the example of FIG. 13(*a*), in use, it may be that aperture 1321 is in front of aperture 1314. In use, the position of aperture 1321 is schematically shown by means of rectangle 1321'. Seen in a direction perpendicular to the plane of the figure, the conjunction of aperture 1314 and aperture 1321' is the specifically selected shape of the pupil that is created in this example. It is to be noted that in the example of FIG. 13(*a*) only a limited number of apertures are provided with a limited amount of different shapes. In practical embodiments, the wheels may have much more apertures with a larger variety of shapes thereby providing more control over the specific shape of the created pupil.

FIG. 13(*b*) schematically shows a flexible pupil arrangement 1330. In so far applicable, discussed characteristics of the flexible pupil arrangement 1300 of FIG. 13(*a*) also apply to the flexible pupil arrangement 1330 of FIG. 13(*b*). Flexible pupil arrangement 1330 comprises two moveable strips 1340, 1350 of an opaque material and the moveable strips 1340, 1350 comprise different apertures 1341 . . . 1346, 1451 . . . 1354 of a different shape and/or size. By moving a specific aperture 1341 . . . 1346 of the first strip 1340 behind or in front of a specific aperture 1351 . . . 1354 of the second strip 1350, a pupil of specific controllable shape can be created. In the example of FIG. 13(*b*), in the viewing direction of the reader, the second strip 1350 is placed in front of the first strip 1340 and aperture 1351 is in front of aperture 1345. Seen in a direction perpendicular to the plane of a figure, the conjunction of the apertures 1351, 1345 defines the shape of the pupil.

FIG. 14(*a*) schematically shows a third embodiment of a flexible pupil arrangement 1400. In so far applicable, discussed characteristics of the flexible pupil arrangement 1300 of FIG. 13(*a*) and the flexible pupil arrangement of 1330 of FIG. 13(*b*) also apply to the flexible pupil arrangement 1400 of FIG. 14(*a*). The flexible pupil arrangement 1400 comprises a plate 1410 or another shape of an opaque material and in the plate is provided an aperture 1420 that defines the largest possible aperture that can be created with the flexible pupil arrangement 1400. The flexible pupil arrangement 1400 also comprises radiation blocking elements 1440, 1441, 1442 that are moveable along one of a multiple of guidance structures 1430. On basis of a control signal, one or more of the radiation blocking elements 1440, 1441, 1442 may move along one of the guidance structures 1430 to a specific position in front of the aperture 1420 or not in front of the aperture 1420. By placing specific radiation blocking elements 1441 at specific positions in front of the aperture 1420, a portion of the aperture cannot transmit radiation and the effective remaining aperture is reshaped towards a smaller aperture of a specific shape. The radiation blocking elements 1440, 1441, 1442 may be box shaped elements of an opaque material. In another embodiment, the radiation blocking element 1440, 1441, 1442 may have a spherical or ellipsoid shape, or may be relatively thin plate shaped elements that are arragned parallel to the plate 1410. The radiation blocking elements 1440, 1441, 1442 may be shaped such that they partially overlay when they are at moved close to each other e.g. in front of the aperture 1420. E.g. the radiation blocking elements 1440, 1441, 1442 may be strips that are arranged in a tilted configuration with respect to the plane defined by the plate 1410. The guidance structures 1430 may be thin wires, or thin strips that are arranged parallel to the plane defined by the plate 1410. The radiation blocking elements 1440, 1441, 1442 may be moved by means of mechanical forces (e.g. by means of actuators), or by electrical or magnetic forces.

FIG. 14(*b*) schematically presents a fourth embodiment of a flexible pupil arrangement 1450. In so far applicable, discussed characteristics of previously discussed flexible pupil arrangement 1300, 1330, 1400 may also apply to the flexible pupil arrangement 1450 of FIG. 14(*b*). The flexible pupil arrangement 1450 comprises an array of controllable micro mirrors 1451 . . . 1456 provided on a supporting structure 1470. In the array of controllable micro mirrors 1451 . . . 1456 groups of micro mirrors 1451 . . . 1456 and/or each individual micro mirror 1451 . . . 1456 is or are controllable in such a way that impinging radiation 1460 may be reflected towards a specific direction, e.g. a first direction d1 or a second direction d2. In an embodiment, the micro mirrors may be configured to controllably reflect impinging radiation in more than two directions. In the example of FIG. 14(*b*) some radiation rays 1460 (e.g. light rays) are schematically indicated. The radiation rays 1460 may originate from a source if the flexible pupil arrangement 1450 is provided in the illumination path. In the example of FIG. 14(*b*), micro mirrors 1452, 1456 are controlled in such a way that impinging radiation is reflected in the second direction d2 and micro mirrors 1453 . . . 1455 are controlled in such a way that impinging radiation is reflected in the first direction d1. If the flexible pupil arrangement 1450 is provided in the illumination path, and if the light that is reflected in the first direction d1 is used for illumination, then the flexible pupil arrangement 1450 has a (virtual) pupil that is defined by all micro mirrors 1453 . . . 1455 that reflect light into the first direction d1.

It is to be noted that the embodiment of FIG. 14(*b*) is also often called a spatial light modulator. Other embodiments of spatial light modulators may also be used a flexible pupil arrangements in the metrology apparatuses 400, 500. Another embodiment of such a spatial light modulator is a kind of Liquid-Crystal Display (LCD) that has an array of pixels that may be controlled in a transmission state or in a radiation blocking state or in a reflection state. An LCD spatial light modulator may be used as a flexible and/or controllable pupil in transmission mode or in reflection mode.

FIG. 6 depicts a number of schematic representations of structures that may be manufactured on a substrate and that may be inspected by the embodiments of the metrology apparatus. Structure 600 has already been discussed above. Structure 650 is a structure in which the first area 610 and the second area 620 partially overlap and are displaced with respect to each other in the y-dimension. Rotations of structure 650 may also form a larger structure that is, for example, similar to structure 600. Structure 660 is similar to structure 650 with a difference that there is no displacement in the y-dimension.

As discussed above, image 700 of FIG. 7 may be processed by a determining system 470 of the metrology apparatus 400. The determining system 470 may be configured to detect a region of interest in the image 700. Regions of interest are regions in the image that are used for further processing and that are used to determine, for example, an overlay value or another characteristic of the structure 460 on the substrate 450. For example, region 790 is identified as a region of interest because it may comprise a predefined pattern or at least a predefined pattern that is similar to an expected pattern. The determining system 470 may be further configured to determine a smaller region of interest for an analysis. For example, as shown at the bottom left side of FIG. 7, a further region of interest 790' may be determined within the image. In this example, the further region of interest 790' is a region of interest for determining an overlay value in the y-dimension. In yet another example, as shown at the bottom right side of FIG. 7, another further region of interest 790" is a region of interest for determining an overlay value in the x-dimension. It is to be noted that if the image on the sensor 440 is only based on higher diffraction orders (higher than $0^{th}$ diffraction orders) then the regions of interest 790, 790', 790" are only based on radiation in the higher diffraction orders of the radiation that is scattered by the structure 460. If, as discussed for example in the context of FIG. 4, the blocking element 428 may be controllable and if it is controllable whether the $0^{th}$ diffraction order impinges on the sensor 440, then the regions of interest 790, 790', 790" may also be determined on basis of an image that is the result of impinging radiation of the $0^{th}$ and higher diffraction orders.

Figure 8:
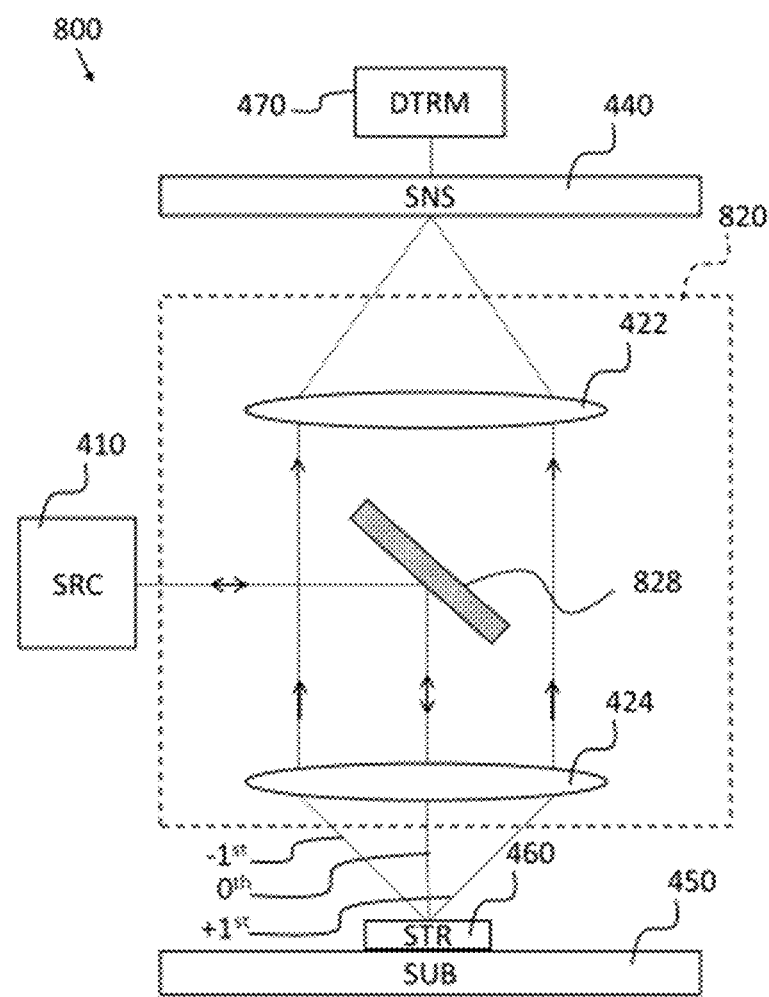
FIG. 8 depicts a schematic representation of a third embodiment of a metrology apparatus.

FIG. 8 depicts a schematic representation of a third embodiment of a metrology apparatus 800. Metrology apparatus 800 is similar to metrology apparatuses 400 and 500 of FIGS. 4 and 5. Differences will be discussed hereinafter. Embodiments of metrology apparatuses 400 and 500 may be combined with the metrology apparatus 800.

Metrology apparatus 800 has a different optical system. Instead of the beam splitter 426 a mirror 828 is provided. The mirror 828 is configured to reflect the radiation originating from the source 410 towards the structure 460 on the substrate 450 at an angle substantially perpendicular to the top surface of the substrate 450. The specular ($0^{th}$) diffraction order that returns from the structure follows also a path that is substantially perpendicular to the top surface of the substrate 450 and also impinges on the mirror 828 and is reflected back towards the source. More details about such a mirror 828 or similar elements in an alignment tool can be found in WO2014/026819A2 (e.g. FIG. 3, mirror 223), WO2014/056708A2, WO2014/068116A1, WO2013/152878A2, which are incorporated herein by reference in their entirety. It is to be noted that, in a configuration that is similar to the metrology apparatus 500 of FIG. 5, the blocking element 528 may be replaced by a mirror that reflects the $0^{th}$ order in a direction that is not towards the sensor 440. Optionally, if the metrology apparatus 500 of FIG. 5 has such a mirror instead of the blocking element 528, the $0^{th}$ diffraction order can be reflected towards an additional sensor that can be used to record information of the $0^{th}$ order. More examples of the recording of information of the $0^{th}$ order are given in the context of FIG. 9.

Figure 9:
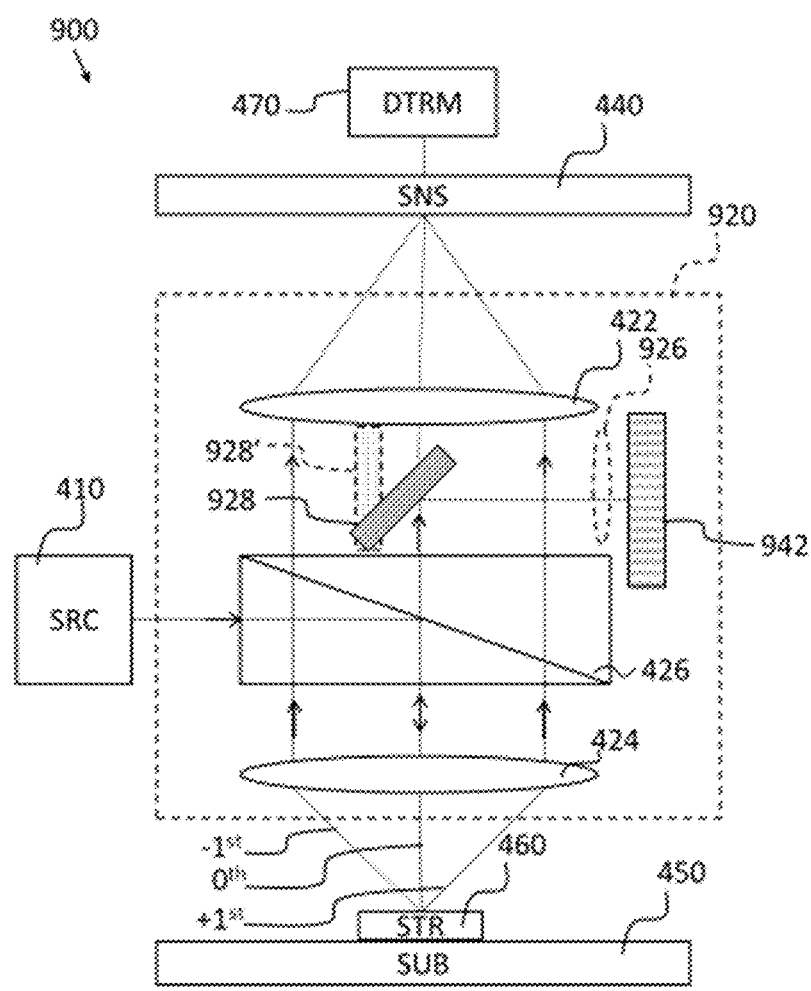
FIG. 9 depicts a schematic representation of a fourth embodiment of a metrology apparatus.

FIG. 9 depicts a schematic representation of a fourth embodiment of a metrology apparatus. Metrology apparatus 900 is similar to metrology apparatuses 400, 500, 800 of FIGS. 4, 5 and 8. Differences will be discussed hereinafter. Embodiments of metrology apparatuses 400, 500 and 800 may be combined with the metrology apparatus 900.

The optical system 920 is different from optical system 420 of metrology apparatus 400. Instead of a blocking element 428 a mirror 928 is provided which reflects the $0^{th}$ diffraction order into a direction that is not towards the sensor 940. In an embodiment, the $0^{th}$ diffraction order is reflected towards a further sensor 942.

The further sensor 942 may be an intensity sensor to sense the intensity of the radiation in the $0^{th}$ diffraction order. This may be used as a reference signal that can be used to normalize, for example, intensities of radiation that are measured with the sensor 440. Thus, the further sensor 942 may have a diagnostics function with respect to, for example, the operation of the source.

The further sensor 942 may be arranged in the pupil plane or a conjugate plane with the pupil plane. Then a pupil image of the $0^{th}$ diffraction order may be recorded and this pupil image may be used as an additional source of input to determine the characteristic of interest of the structure 460. The pupil images can be used in a reconstruction process to determine the geometrical structure of structure 460 on the substrate 450. It is also know that there may be, depending on the structure 460, overlay value information available in the pupil image.

In a further embodiment of the optical system 920 there is also a further lens 926 in a path from the mirror 928 to the further sensor 942 and the further lens 926 forms a bright field image of the structure 460 on the sensor 942. The further sensor 942 may be configured to record the bright field image. The bright field image may be used for reference purposes, or for alignment purposes, or for roughly estimating overlay values, etc. For example, a rough overlay value is determined in the bright field image based on techniques that are known in the art (as discussed in one or more of the incorporated documents). The rough overlay value may be used to decide whether a process is out of spec. The rough overlay value may also be used to decide whether a more precise value must be determined on basis of the (dark field) image that is formed on sensor 440. The further sensor 942 may also be coupled to the determining system 470 or may be coupled to a further determining system. If the further sensor 942 is used for alignment purposes, the determining system would try to recognize the expected structure in the recorded image to determine whether the structure is within the spot of illumination. The determining system may be coupled to actuators that are operable to move the substrate and then the metrology apparatus is operable to search for the structure by an iterative move and detect algorithm.

The further sensor 942 may further cooperate with the determining system 470 for detecting a region of interest, for example, the region of interest 790, 790', 790" of FIG. 7.

The information recorded by the further sensor 942, which is either a pupil image of the $0^{th}$ diffraction order or an image of the structure 460 based on the $0^{th}$ diffraction image, may be used to detect characteristics of a part of the optical system 920. For example, aberrations may be detected and the detected aberrations may be used by, for example, the determining system 470 to correct the image recorded by sensor 440. There may also be a reference structure on the substrate 450 or there may be a fiducial target on the wafer table that supports the substrate 450 that is designed to allow a good detection of characteristics of the optical system 920, such as aberration of optical elements of the optical system 920.

Optionally, a position of mirror 928 is controllable. At a first position mirror 928 reflects the $0^{th}$ diffraction order towards, for example, sensor 942. At a second position mirror 928' does not block the transmission of the $0^{th}$ diffraction order towards sensor 440. Such a controllable mirror enables that the metrology apparatus 900 is capable to switch between dark field imaging and bright field imaging. In FIG. 9 it is suggested that the mirror 928 is capable of rotating around an axis. Alternatively mirror 928 is moved by means of a translation towards a position completely outside the detection path of the optical system 920.

Figure 10:
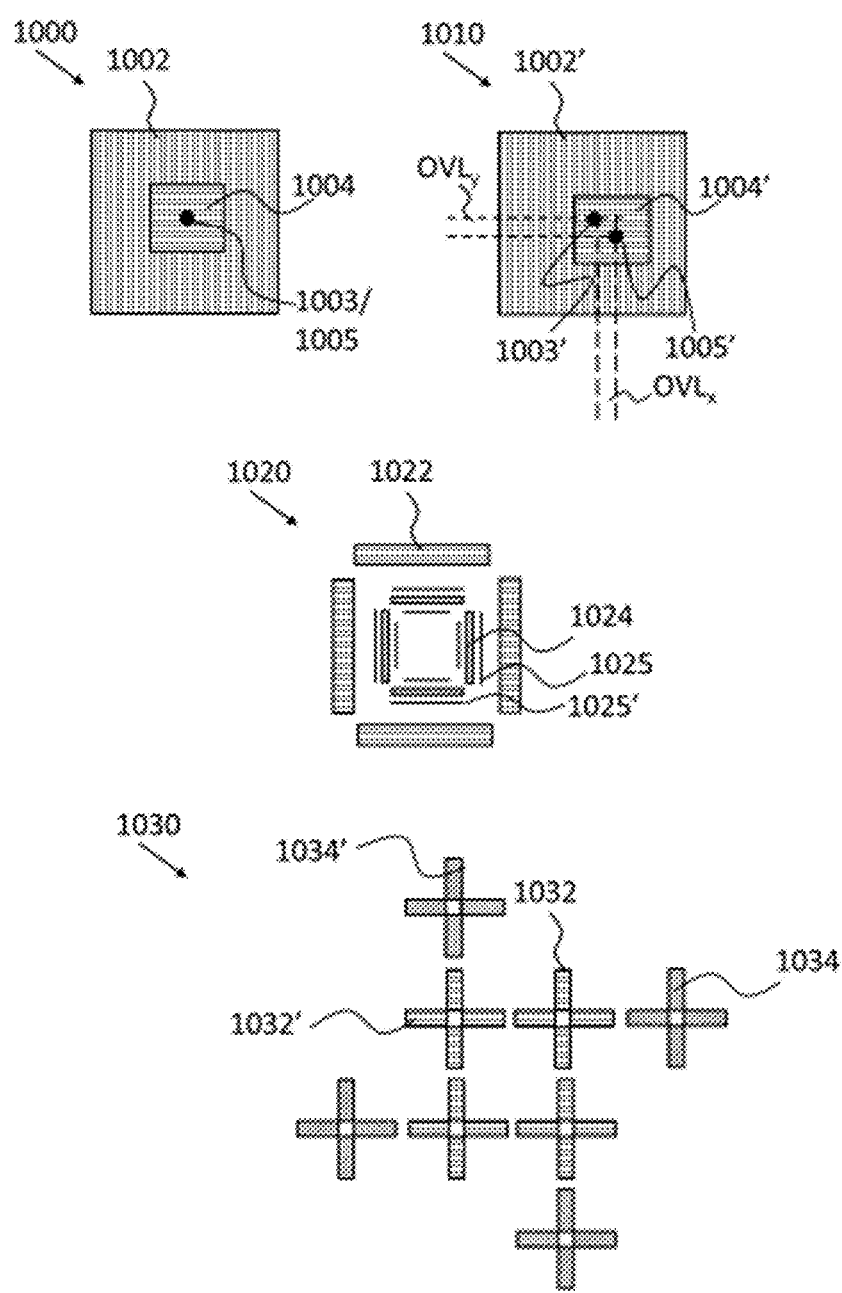
FIG. 10 depicts schematic representations of structures to be manufactured on the substrate to determine overlay values.

FIG. 10 depicts schematic representations of structures to be manufactured on the substrate to determine overlay values.

At the top left of FIG. 10 is presented a box in box structure 1000 that may comprise a first structure 1002 in a first layer and that may comprise a second structure in a second layer 1004. The first structure 1002 and the second structure 1004 may be a square or, alternatively, they may be rectangularly shaped. Even in other embodiment they may be triangular, circular or elliptical. The presented structure 1000 is the structure that may be manufactured under ideal manufacturing conditions with use of, for example, the lithographic apparatus of FIG. 1. The ideal manufacturing conditions relate, for example, to the absence of an overlay error. It must also be noted that, in practical embodiments, the manufactured structures 1002, 1004 on the substrate 450 may have round corners. In structure 1000 also a dot is presented that indicates the center of gravity 1003 of the first structure 1002 and the center of gravity 1005 of the second structure 1004. Because in structure 1000 there is no overlay error, the centers of gravity 1003, 1005 are on top of each other. For sake of clarity it is indicated that the dots that represent the centers of gravity are not present in the structure 460 on the substrate 450 but are only drawn in the figure to schematically indicate the centers of gravity. In practical embodiments the determining system searches in the recorded image for the center of gravity by known methods or algorithms.

As presented at structure 1010, there may be an overlay error in the manufacturing process and that is detectable by means of a displacement of the second structure 1004' with respect to the first structure 1002', and, thus, also a displacement of the center of gravity 1003' of the first structure 1002' with respect to the center of gravity 1005' of the second structure 1004'. A distance between the centers of gravity 1003', 1005' in the x-dimension is the overlay value $OVL_x$. A distance between the centers of gravity 1003', 1005' in the y-dimension is the overlay value $OVL_y$. In another embodiment, the determining system 470 is operable to find corners of the structures 1002', 1004' by means of pattern recognition and a displacement between the corners may be a basis for determining the overlay value(s).

Structure 1020 represents another structure that can be used to determine overlay values. The structure 1020 is a bar in bar structure and comprises elongated rectangular first structures 1022 in a first layer and comprises elongated rectangular second structures 1024 in a second layer. All structures that have the same hatching are to be manufactured in the same layer. The structure 1020 as presented is manufactured under ideal manufacturing conditions. It is to be noted that, in practical embodiments, the corners of the bars 1022, 1024 may be rounded and that line ends may become shortened. An overlay value in the x-dimension can be detected by analyzing displacements of the vertical bars and an overlay value in the y-dimension can be detected by analyzing displacements of the horizontal bars. In line with the example of structures 1000, 1010 an overlay value can also be determined by detecting a displacement of a center of gravity of the first structures 1022 with respect to a center of gravity of the second structure 1024.

Optionally, on a printing device, such as for example a reticle, that is used to print/manufacture the second structures 1024, sub-resolution assist features 1025, 1025' may be present to assist the printing of the second structure 1024. Please note that sub-resolution assist features 1025, 1025' do, in general, not print on the substrate 450 and they are not present in the structure 460 on the substrate 450.

Structure 1030 comprises several cross-shaped structures 1032, 1032', 1034, 1034'. The first cross-shaped structure 1032, 1032' are to be manufactured in a first layer and the second cross-shaped structures 1034, 1034' are to be manufactured in a second layer. All structures that have the same hatching are to be manufactured in the same layer. The structure as presented is the structure that has to appear on the substrate 450 if the manufacturing conditions are ideal. It is to be noted that, in practical embodiments, the corners of the structures 1032, 1032', 1034, 1034' may be rounded and that line ends may become shortened. If the manufacturing conditions are not ideal, the first cross-shaped structures 1032, 1032' are displaced with respect to the second cross-shaped structures 1034, 1034'. The overlay values in the different dimensions can be obtained to analyze a specific displacement between two or more of the cross-shaped structures 1032, 1032', 1034, 1034'. For example, an overlay value in the y-dimension can be easily determined by determining a displacement distance of the first cross-shaped structure 1032 with respect to the second cross-shaped structure 1034. For example, an overlay value in the x-dimension can be easily determined by determining a displacement distance of the first cross-shaped structure 1032' with respect to the second cross-shaped structure 1034'. In the context of structure 1030 it is also to be noted that patterning devices, such as reticles, that are used to manufacture structure 1030, may comprise sub-resolution assist features that assist in the printing of first and second cross-shaped structures 1032, 1032', 1034, 1034'. Features similar to 1025, 1025' may be present close to the lines of the of first and second cross-shaped structures 1032, 1032', 1034, 1034'.

Other multi-layer structures that can be used for determining overlay values are disclosed, for example, in FIG. 4 of "Diffraction order control in overlay metrology: a review of the roadmap options", Mike Adel, et al, "Metrology, Inspection, and Process Control for Microlithography XXII", Proceedings of SPIE, Vol. 6922, paper 692202, 2008, which is hereby incorporated by reference in its entirety.

Figure 11:
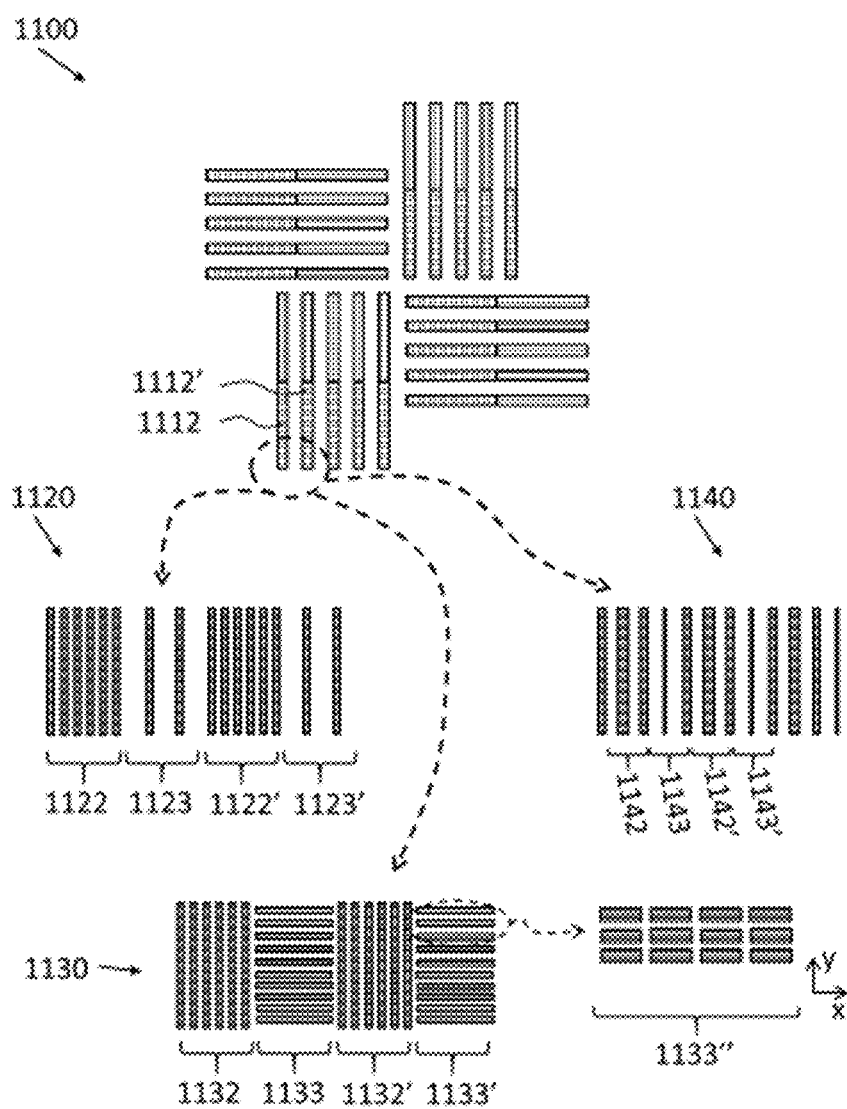
FIG. 11 depicts schematic representations of sub-segmentations of embodiments of targets.

FIG. 11 depicts schematic representations of sub-segmentations of embodiments of targets. At the top of FIG. 11 is presented a possible target 1100 that may be used to determine overlay between different layers. The picture that is shown of target 1100 is the picture that is, under ideal circumstances, visible as an image on the sensor 440 of previously discussed metrology apparatuses. The structure 460 on substrate 450 may be different and depending on the illumination and detection characteristics, one may obtain the image of target 1100 that is presented at the top of FIG. 11. In line with for example FIGS. 6, 7 and 10, features drawn with different hatching relate to features in different layers of the structure 460 on substrate 450.

In general the idea is that the structures 460 on the substrate 450 may have, for the features that are visible (and/or invisible as a "space"), a number of smaller features. This is often termed "sub segmentation of the features". As will be discussed later, areas that are presented in target 1100 as "spaces" may have relatively small features that are, for example, not visible on the sensor 440 as individual small features (e.g. each individual line may not be visible on the image recorded by the sensor 440). Sub segmentation may be used for influencing the contrast between different portions of the target 1100. Thus, the sub segmentation may have influence on the image on the sensor 440.

A first embodiment of sub segmentation 1120 is presented at the middle left side of FIG. 11. It is shown that for example features 1112, 1112' of a target are present on the substrate as dense configurations 1122, 1122' of lines at a relatively small pitch. The spaces between features 1112, 1112' of target 1100 may still have configurations 1123, 1123' of a few relatively narrow lines at a larger pitch than the pitch of configurations 1122, 1122'. The configurations 1123, 1123' scatter light in a different manner than the configuration 1122, 1122' and are, therefore, imaged in a different way on the sensor 440.

A second embodiment of sub segmentation 1130 is presented at the bottom of FIG. 11. The features 1112, 1112' of target 1100 may be present on the substrate as configurations 1132, 1132' that have a dense pattern of vertical lines at a certain pitch. The spaces between features 1112, 1112' of target 1100 may be present on the substrate as configurations 1133, 1133' that have a dense pattern of horizontal lines at a certain pitch. In particular if the structure on the substrate with this sub segmentation 1130 is illuminated with radiation of a certain polarization, one of the configurations may scatter more light than other configurations. In addition, the higher diffraction orders of configurations 1132, 1132' have, seen in a top view, another direction than the higher diffraction order of configurations 1133, 1133'. The different directions of the higher diffraction orders enable that in the optical systems of the previously discussed metrology apparatuses the higher diffraction orders of one of the two different configurations may be blocked by a specific detection pupil. Embodiments of detection pupils have been discussed in the context of FIG. 5 and/or FIG. 12. In general this form of sub segmentation has areas where features are arranged in different directions to distinguish, in the image that is formed on e.g. sensor 440, certain areas of the structure from other areas of the structure.

A third embodiment of sub segmentation 1140 is presented at the middle right side of FIG. 11. In this structure the pitch between all features is equal but the width of the lines varies from thin to wide to thin, etc. Thereby there are first areas 1142, 1142' that may be imaged as a feature on the sensor 440 and there are second areas 1143, 1143' that may not be imaged as a feature on the sensor 440. In this form of sub segmentation, the width of the lines are modulated according to a specific pattern or function.

It is to be noted that in the above examples 1120, 1130, 1140 of sub segmentation, the sub segmentation was performed in a single dimension per portion or area of the target. At the bottom right side of FIG. 11 it has been show that in another example, the sub segmentation may be performed in two dimensions. E.g. the area that is indicated in the third embodiment 1130 of sub segmentation with 1133' the sub segmentation consists of relatively small horizontal lines. In another example, the relatively small features of the sub segmentation may be a repetitive pattern of small features in the x- and y-dimension as indicated at 1133". For example, the relatively small horizontal lines may be sub divided in relatively small rectangular features that are placed in a two dimensional grid structure. In all examples of sub segmentation 1120, 1130, 1140 each presented line may also be sub divided in smaller line segments.

Creating sub segmentations may be useful for having a higher correlation between process effects on the target 1100 on the substrate 450 and the process effects that influence the product/in-die structures on the substrate 450. In other words, the target is more representative for product/in-die structures. Furthermore, because of design rule requirements there is a need to prevent too wide lines and/or to prevent relatively large empty areas on the substrate 450. As discussed earlier, the sub segmentation may also be used to influence the contrast between the different portions/areas of the target. The sub segmentation influences the diffraction efficiency of the portions/areas of the target. Thereby the sub segmentation influences the contrast between the different portions/areas of the target in the image that is formed on e.g. the sensor 440.

In the sub segmentations 1120, 1130, 1140 a pitch, line width and relative line orientation may be selected such that the scatter efficiency is relatively large. In other words, the pitch, line widths and relative line orientations are selected to have the scatter efficiency above a predefined threshold. Thus, a relative large amount of the illumination radiation is scattered into the higher diffraction orders such that the amount of radiation that impinges on the sensor 440 is relatively high. Furthermore, a pitch, line width and relative line orientation may be selected such that an optical contrast of an image obtained by sensor 440 is relatively large. The relative large optical contrast may be beneficial to extract a relative accurate overlay value from the image obtained by sensor 440.

Sub segmentations 1120, 1130, 1140 are examples of sub segmentations that are based on different principles. Within a certain target 1100 different types of sub segmentation may be combined. The skilled person is also capable of applying some of the presented principles in two dimensions by creating, e.g., in sub-segmentation 1120 also a sub-segmentation in the y-dimension.

In the discussion of the examples of FIG. 6 and FIG. 11, it is assumed that the targets 600, 650, 660, 1100 have structures 612, 1112 in a first layer of a manufactured 3d structure on a wafer and have structures 622 in a second layer of the manufactured 3d structure on the wafer. However, it is not necessary that the structures are provided in different layers. They might also be located in a single layer of the manufactured 3d structure on the wafer, but they are not manufactured in the same lithographic step. For example, with double patterning or a Litho-Etch-Litho-Etch process one can manufacture during each lithographic step different structures in the same layer of the 3d structure. The structures that are manufactured during these different lithographic steps may have a displacement with respect to each other as the result of alignment errors and, consequently, overlay errors may be present between the structures. Thus, if the targets 600, 650, 660, 1100 are manufactured by creating structures 612, 1112 with a first lithographical step and the structures 622 with a second lithographical step, one can use the targets 600, 1100 also to measure overlay errors that are the result of the use of two lithographic steps. The two lithographic steps may be used to manufacture structures in different layers or in the same layer. It is to be noted that this may also apply to the targets 1020, 1030 of FIG. 10.

Figure 15:
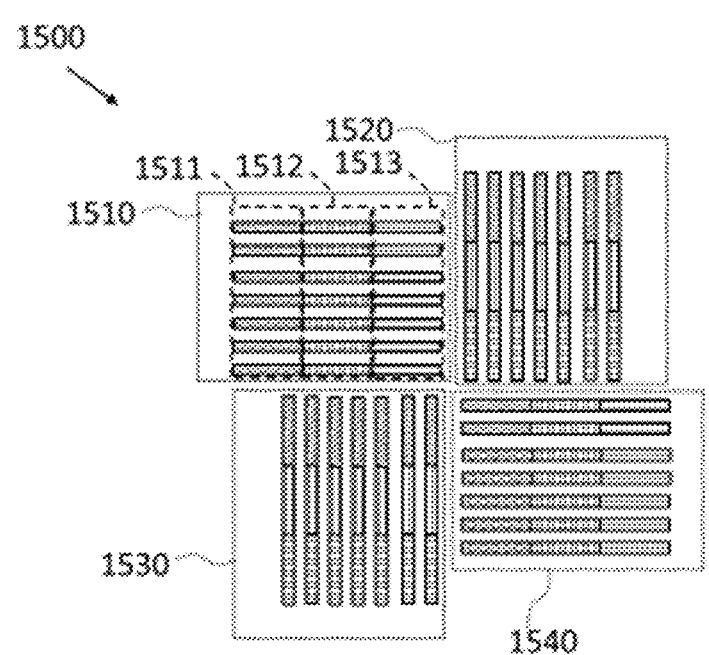

FIG. 15 schematically presents a further embodiment of a target 1500. Target 1500 has a similar structure as targets 600, 1100 and, in so far applicable, discussed characteristics of targets 600, 1100 may also apply to target 1500. In FIG. 15 boxes with dashed lines are shown. These boxes are groups of structures. The dashed lines are not present on a substrate that is printed but are only used to indicate which structures for a group. Target 1500 has four groups 1510, 1520, 1530, 1540 of structures. Two groups 1510, 1540 of structures can be used to measure overlay errors in a first dimension and the two other groups 1520, 1530 of structures can be used to measure overlay errors in a second dimension. The principles of determining overlay errors from an image that is created with the previously discussed metrology apparatus are discussed, for example, in the context of FIG. 7. Only for one specific group 1510 of structures, substructures 1511, 1512, 1513 are indicated. In the other groups 1520, 1530, 1540 of structures, the substructure having a hatching equal to the hatching of substructures 1511, 1512, 1513 have the same characteristics of the substructures 1511, 1512, 1513 as discussed hereinafter.

Substructures 1511, 1512, 1513 are manufactured with different lithographic steps. They may be present in the same layer of the 3d structure that is being manufactured on the wafer. They may also be present in different layers of the 3d structure that is being manufactured on the wafer. It is also possible that two types of substructures 1511, 1512, 1513 are in the same layer, while the third type of substructure 1511, 1512, 1513 is in another layer. Assuming that substructures 1511 are manufactured by a first lithographic step, assuming that substructures 1512 are manufactured by a second lithographic step, and assuming that substructures 1513 are manufactured by a third lithographic step, then target 1500 may be used to determine overlay errors between the first lithographic step and the second lithographic step, between the second lithographic step and the third lithographic step and also between the first lithographic step and the third lithographic step. By using target 1500 one may measure multiple overlay errors in a one measurement step, while, when target 600 is used, at least two targets and two measurement steps were necessary. Thus target 1500 provides speed benefits and also a reduction of space on the wafer that is used by metrology targets.

It is to be noted that the example of target 1500 provides three types of substructures 1511, 1512, 1513. Of course it is also possible to provide more than two or three types of substructures such that with a single target overlay errors between more layers and/or more lithographical steps can be measured.

It is also to be noted that in cases where not directly lithography, but other wafer processing steps are used to manufacture separate structures in a single layer, the different types of substructures 1511, 1512, 1513 may be used to measure overlay errors that are induced by the specific wafer processing steps, or combinations of different processing steps, optionally in combination with lithographical steps.

Further embodiments are disclosed in the subsequent numbered clauses:

1. A metrology apparatus for determining a characteristic of interest relating to at least one structure on a substrate, the metrology apparatus comprising
   a sensor for detecting characteristics of radiation impinging on the sensor,
   an optical system being configured to illuminate the at least one structure with radiation received from a source and the optical system being configured to receive radiation scattered by the at least one structure and to transmit the received radiation to the sensor.

2. A metrology apparatus according to clause 1, wherein the optical system comprises an illumination path from the source to the structure on the substrate and a detection path from the structure on the substrate to the sensor, wherein, optionally, a portion of the illumination path overlaps with the detection path.

3. A metrology apparatus according to any one of the clauses 1 and 2, wherein
   the sensor is arranged in an image plane of the optical system or the sensor is arranged in a plane conjugate with the image plane, and
   the optical system is configured to image the at least one structure on the sensor and wherein, optionally, features of the structure can be individually distinguished in an image being formed on the sensor.

4. A metrology apparatus according to any one of the preceding clauses, wherein the optical system is configured to prevent a transmission of radiation of the $0^{th}$ diffraction order of the scattered radiation towards the sensor.

5. A metrology apparatus according to clause 4, wherein the optical system comprises a blocking element for blocking the transmission of the $0^{th}$ diffraction order of the scattered radiation towards the sensor.

6. A metrology apparatus according to clause 4, wherein the blocking element is controllable in a first position where the blocking element is operable to block the transmission of the $0^{th}$ diffraction order of the scattered radiation towards the sensor and the blocking element is controllable in a second position where the blocking element does not block the transmission of the $0^{th}$ diffraction order of the scattered radiation towards the sensor.

7. A metrology apparatus according to any one of the clauses 5 and 6, wherein the blocking element is a mirror that reflects the $0^{th}$ diffraction order into a direction that is not towards the sensor.

8. A metrology apparatus according to clause 7, wherein the mirror reflects the $0^{th}$ order diffraction order to a further sensor and, optionally, an imaging lens is provided in between the mirror and the further sensor for creating a bright field image of the structure on the further sensor.

9. A metrology apparatus according to any one of the preceding clauses, wherein the characteristic of interest is an overlay value between a first layer and a second layer on the substrate and the at least one structure comprising features in the first layer and in the second layer.

10. A metrology apparatus according to clause 9, wherein at least one of:
   the at least one structure comprises a repetitive structure of features within a first area in the first layer,
   the at least one structure comprises a repetitive structure of features within a second area in the second layer,
   and, optionally, a pitch of the features in the first layer is substantially identical to a pitch of the features in the second layer.

11. A metrology apparatus according to clause 10, wherein at least one of
in a top view of the substrate, the first area and the second area are at least partially non-overlapping,
the first area and the second area are adjacent to each other,
in a top view of the substrate, the first area and the second area do not overlap.

12. A metrology apparatus according to any one of the preceding clauses further comprising a determining system
being configured to receive a signal from the sensor representing an image being recorded on the sensor and
being configured to determine the overlay value on basis of a displacement of the features in a first layer of the substrate with respect to the features in a second layer of the substrate, wherein the displacement is determined on basis of the image.

13. A metrology apparatus according to any one of the preceding clauses wherein the optical system comprises one or more lenses wherein at least a subset of the one or more lenses is configured to focus the received radiation from the source in a spot on the structure and wherein at least a further subset of the lenses is configured to transmit the radiation scattered by the at least one structure to the sensor.

14. A metrology apparatus according to clause 13 wherein the one or more lenses are configured to image the at least one structure on the sensor.

15. A metrology apparatus according to any one of the clauses 13 and 14, wherein the one or more lenses have a small aberration.

16. A metrology apparatus according to any one of the preceding clauses, wherein the optical system has a numerical aperture that is larger than 0.5, or optionally larger than 0.7, or optionally larger than 0.9.

17. A metrology apparatus according to any one of the preceding clauses, wherein a numerical aperture of the optical system is high enough to capture at least one of a plus and a minus first diffraction order of the scattered radiation for transmission to the sensor.

18. A metrology apparatus according to any one of the preceding clauses further comprising the source.

19. A metrology apparatus according to clause 18, wherein the source is configured to generate radiation having one or more wavelengths in a wavelength range from 200 nm to 2000 nm, or optionally, in a range from 300 nm to 1500 nm, or optionally, in a range from 400 nm to 800 nm.

20. A metrology apparatus according to any one of the clauses 18 and 19, wherein the source is configured to generate, in use, a radiation having a power larger than 50 Watt, or optionally, larger than 150 Watt, or optionally, larger than 250 Watt, or optionally, larger than 1000 Watt.

21. A metrology apparatus according to any one of the preceding clauses, the sensor having a signal/noise level higher than 1, or optionally, higher than 10.

22. A metrology apparatus according any one of the preceding clauses wherein the sensor comprises an array of pixels for generating an image of impinging radiation.

23. A metrology apparatus according to any one of the preceding clauses wherein the optical system comprises a first polarizer for polarizing the radiation that illuminates the at least one structure, the first polarizer being provided in the illumination path.

24. A metrology apparatus according to any one of the preceding clauses wherein the optical system comprises a second polarizer for allowing the transmission of scattered radiation to the sensor that has a particular polarization, the second polarizer being provided in the detection path.

25. A metrology apparatus according to any one of the clauses 23 or 24, wherein at least one of the first polarizer and the second polarizer is a controllable polarizer being capable to allow the transmission of radiation having a specific polarization as indicated in a polarization control signal.

26. A metrology apparatus according to any one of the preceding clauses wherein the optical system comprises a wavelength filter for allowing the transmission of radiation within a wavelength range, the wavelength filter being provided in at least one of the illumination path and the detection path of the optical system.

27. A metrology apparatus according to any one of the preceding clauses wherein the wavelength filter is a controllable wavelength filter being capable to allow the transmission of radiation in a selectable wavelength range in dependence of a wavelength control signal.

28. A metrology apparatus according to any one of the preceding clauses wherein the optical system and/or the source is configured to enable the illumination of the at least one structure with radiation having a wavelength that results in capturing at least one higher diffraction order of the scattered radiation by the optical system for transmission to the sensor.

29. A metrology apparatus according to any one of the preceding clauses wherein the optical system and/or the source is configured to enable the illumination of the at least one structure with a plurality of wavelengths.

30. A method of determining a characteristic of interest relating to at least one structure on a substrate, the method comprising:
illuminating the structure with radiation via an illumination path of an optical system,
receiving radiation being scattered by the structure on a sensor via a detection path the optical system.

31. A method of determining a characteristic of interest relating to at least one structure on a substrate, the characteristic of interest is an overlay value between a first layer and a second layer on the substrate and the at least one structure comprising features in the first layer and in the second layer. the method comprising:
illuminating the structure with radiation via an optical system,
receiving radiation being scattered by the structure with the optical system, the optical system comprising a sensor in an image plane of the optical system or a plane conjugate with the image plane,
imaging the at least one structure on the sensor with the optical system while preventing a transmission of the $0^{th}$ diffraction order of the scattered radiation towards the sensor,
recording an image with the sensor,
determining the overlay value on basis of a displacement of the features in the first layer of the substrate with respect to the features in the second layer of the substrate, the displacement being determined on basis of the image.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A metrology apparatus comprising:
a first sensor configured to detect characteristics of radiation impinging thereon;
an optical system configured to:
  illuminate at least one structure with radiation received from a source,
  receive radiation scattered by the at least one structure,
  transmit the received radiation to the first sensor,
  image the at least one structure on the first sensor, and
wherein the optical system comprises a mirror configured to:
  block transmission of $0^{th}$ diffraction order of the scattered radiation towards the first sensor, and
  reflect the $0^{th}$ diffraction order in a direction that is not towards the first sensor but towards a second sensor,
  wherein the first sensor is arranged in an image plane of the optical system or in a plane conjugate with the image plane; and
a determining system configured to:
  receive a first signal from the first sensor representing a first image being recorded on the first sensor and a second signal from the second sensor representing a second image being recorded on the second sensor, and
  determine an overlay value based on the first signal, the second signal, and a displacement of first features in a first layer of the substrate with respect to second features in a second layer of the substrate.

2. The metrology apparatus of claim 1, further comprising an imaging lens provided between the mirror and the second sensor to create a bright field image of the at least one structure on the second sensor.

3. A metrology apparatus comprising:
a first sensor configured to detect characteristics of radiation impinging thereon;
an optical system configured to:
  illuminate at least one structure with radiation received from a source,
  receive radiation scattered by the at least one structure,
  transmit the received radiation to the first sensor,
  image the at least one structure on the first sensor, and
  prevent, using a blocking element in a first operational mode, a transmission of radiation of a $0^{th}$ diffraction order of the scattered radiation towards the first sensor, and
  reflect the $0^{th}$ diffraction order in a direction that is not towards the first sensor but towards a second sensor,
  wherein the first sensor is arranged in an image plane of the optical system or in a plane conjugate with the image plane; and
a determining system configured to:
  receive a first signal from the first sensor representing a first image being recorded on the first sensor and a second signal from the second sensor representing a second image being recorded on the second sensor, and
  determine an overlay value based on the first signal, the second signal, and a displacement of first features in a first layer of the substrate with respect to second features in a second layer of the substrate, and
wherein the optical system is configured to operate in the first operational mode or a second operational mode,
wherein in the first operational mode the blocking element is controllable in a first position where the blocking element is operable to block the transmission of the $0^{th}$ diffraction order of the scattered radiation towards the first sensor, and
wherein in the second operational mode the blocking element is controllable in a second position where the blocking element does not block the transmission of the $0^{th}$ diffraction order of the scattered radiation towards the first sensor.

4. A method of determining a characteristic of interest relating to at least one structure on a substrate, the characteristic of interest is an overlay value between a first layer and a second layer on the substrate and the at least one structure comprising features in the first layer and in the second layer, the method comprising:
  illuminating the at least one structure with radiation,
  receiving, with an optical system, radiation that is scattered by the at least one structure, the optical system comprising a first sensor in an image plane of the optical system or a plane conjugate with the image plane,
  imaging the at least one structure on the first sensor with the optical system while preventing, using a mirror, a transmission of a $0^{th}$ diffraction order of the scattered radiation towards the first sensor, and reflecting the $0^{th}$ diffraction order in a direction towards a second sensor,
  recording a first image with the first sensor and a second image with the second sensor, and
  determining on basis of the first image and the second image the overlay value on basis of a displacement of the features in the first layer of the substrate with respect to the features in the second layer of the substrate.

* * * * *

UNITED STATES PATENT AND TRADEMARK OFFICE
CERTIFICATE OF CORRECTION

PATENT NO. : 10,809,632 B2
APPLICATION NO. : 16/181455
DATED : October 20, 2020
INVENTOR(S) : Den Boef et al.

Page 1 of 1

It is certified that error appears in the above-identified patent and that said Letters Patent is hereby corrected as shown below:

On the Title Page

Item (30), Foreign Application Priority Data is omitted: please add EP 17200265.1 filed November 7, 2017, EP 17204158.4 filed November 28, 2017, and EP 17207587.1 filed December 15, 2017.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*